(12) United States Patent
Sakurai

(10) Patent No.: US 9,252,168 B2
(45) Date of Patent: Feb. 2, 2016

(54) PHOTOELECTRIC CONVERSION DEVICE

(71) Applicant: CANON KABUSHIKI KAISHA, Tokyo (JP)

(72) Inventor: Katsuhito Sakurai, Machida (JP)

(73) Assignee: CANON KABUSHIKI KAISHA, Tokyo (JP)

(*) Notice: Subject to any disclaimer, the term of this patent is extended or adjusted under 35 U.S.C. 154(b) by 346 days.

(21) Appl. No.: 13/713,989

(22) Filed: Dec. 13, 2012

(65) Prior Publication Data

US 2013/0153977 A1 Jun. 20, 2013

(30) Foreign Application Priority Data

Dec. 15, 2011 (JP) ................................ 2011-274889

(51) Int. Cl.
| | |
|---|---|
| H04N 5/335 | (2011.01) |
| H04N 3/14 | (2006.01) |
| H01L 27/142 | (2014.01) |
| H04N 5/357 | (2011.01) |
| H04N 5/365 | (2011.01) |
| H04N 5/374 | (2011.01) |
| H04N 5/378 | (2011.01) |
| H01L 27/146 | (2006.01) |

(52) U.S. Cl.
CPC ........ *H01L 27/1422* (2013.01); *H01L 27/1464* (2013.01); *H01L 27/14603* (2013.01); *H01L 27/14609* (2013.01); *H04N 5/3575* (2013.01); *H04N 5/3658* (2013.01); *H04N 5/378* (2013.01); *H04N 5/3742* (2013.01)

(58) Field of Classification Search
CPC ... H04N 5/378; H04N 5/3658; H04N 5/3575; H04N 5/3742; H01L 27/1422; H01L 27/14603; H01L 27/14609; H01L 27/1464

USPC .................. 348/308, 294, 300, 301, 302, 281
See application file for complete search history.

(56) References Cited

U.S. PATENT DOCUMENTS

| | | | |
|---|---|---|---|
| 6,130,423 A * | 10/2000 | Brehmer et al. | ........... 250/208.1 |
| 6,339,215 B1 | 1/2002 | Yonemoto | |
| 6,518,910 B2 | 2/2003 | Sakuragi | |
| 7,068,312 B2 | 6/2006 | Kakumoto | |
| 7,091,978 B2 | 8/2006 | Yoshimura | |
| 7,133,074 B1 * | 11/2006 | Brehmer et al. | ............... 348/308 |
| 7,542,086 B2 | 6/2009 | Hagihara | |
| 8,179,465 B2 * | 5/2012 | Tanaka | .......................... 348/308 |
| 2010/0302425 A1 * | 12/2010 | Boemler | ........................ 348/308 |
| 2012/0199930 A1 * | 8/2012 | Hayashi | ........................ 257/435 |

FOREIGN PATENT DOCUMENTS

| | | |
|---|---|---|
| JP | 2001-157114 A | 6/2001 |
| JP | 2003-259228 A | 9/2003 |

* cited by examiner

*Primary Examiner* — Sinh Tran
*Assistant Examiner* — Zhenzhen Wu
(74) *Attorney, Agent, or Firm* — Canon USA, Inc. IP Division

(57) ABSTRACT

A photoelectric conversion device according to one or more embodiments includes a plurality of photoelectric conversion units. A readout portion is configured to output current signals to an output line. Each of the current signals is based on an amount of charges generated by a corresponding one of the photoelectric conversion units. The readout portion includes a plurality of transistors including at least a plurality of first input transistors and a plurality of second input transistors. Each of the first input transistors and a corresponding one of the second input transistor form a differential pair. Of the plurality of the transistors, any transistors repeatedly arranged correspondingly to every one or more of the photoelectric conversion units have the same conductivity type.

16 Claims, 18 Drawing Sheets

PHOTOELECTRIC CONVERSION DEVICE

BACKGROUND OF THE INVENTION

1. Field of the Invention

The disclosure relates to a photoelectric conversion device.

2. Description of the Related Art

Japanese Patent Laid-Open No. 2001-157114 describes an image sensor including a plurality of pixels, each of which includes a photodiode and a differential output unit. The differential output unit converts a difference of voltages stored in two storing units into a current signal, and outputs the current signal.

SUMMARY OF THE INVENTION

A photoelectric conversion device according to one or more embodiments includes a plurality of photoelectric conversion units. A readout portion is configured to output current signals to an output line. Each of the current signals is based on an amount of charges generated by a corresponding one of the photoelectric conversion units. The readout portion includes a plurality of transistors including at least a plurality of first input transistors and a plurality of second input transistors. Each of the first input transistors and a corresponding one of the second input transistor form a differential pair. Of the plurality of the transistors, any transistors repeatedly arranged correspondingly to every one or more of the photoelectric conversion units have the same conductivity type.

Further features of the disclosure will become apparent from the following description of exemplary embodiments with reference to the attached drawings.

DESCRIPTION OF THE EMBODIMENTS

Figure 1:
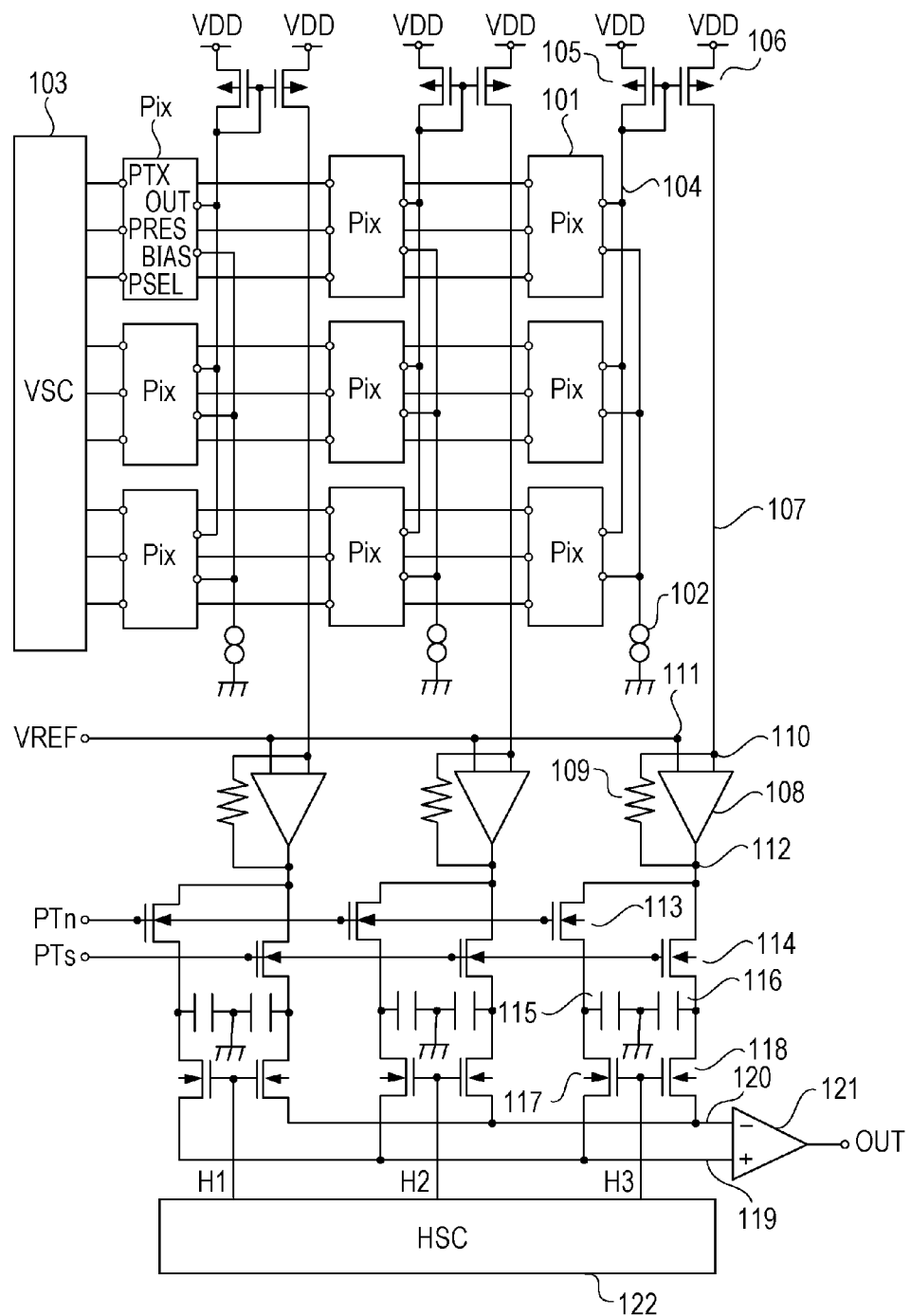
FIG. 1 illustrates an equivalent circuit of a first exemplary embodiment.

A photoelectric conversion device according to an embodiment includes a plurality of photoelectric conversion units and a readout portion. The readout portion includes a plurality of transistors and outputs, into a common output line, a current signal based on a signal from the photoelectric conversion unit. In detail, the readout portion includes a plurality of differential amplifiers, each of which outputs a current signal based on the amount of charges generated by the corresponding photoelectric conversion unit.

Of the plurality of transistors included in the readout portion, transistors each of which is repeatedly, or periodically, arranged every one or more of the photoelectric conversion units whose signals are to be output into a common output line have the same conductivity type. In other words, any transistors included in a pixel have the same conductivity type. The pixel may be defined as a repeated unit, or a periodical unit, including the photoelectric conversion unit and the corresponding transistors. At least one photoelectric conversion unit is included in the pixel.

The differential amplifier includes first and second input transistors which form a differential pair. A voltage signal from the photoelectric conversion unit is input to the gate of the first input transistor. A reference voltage is provided for the gate of the second input transistor. A current signal corresponding to the difference between the voltage signal from the photoelectric conversion unit and the reference voltage is output via the drain of the second input transistor. The drain of the second input transistor is electrically connected to the common output line, whereby the current signal from the pixel may be output into the common output line. The differential pair is repeatedly, or periodically, provided for every one or more of the photoelectric conversion units. Thus, each pixel includes the first and second input transistors. The first and second input transistors have the same conductivity type as other transistors included in the pixel.

The conductivity type may be an N-type channel or a P-type channel. For example, a transistor which has an N-type source region and an N-type drain region may have an N-type channel.

In one or more embodiments, sensitivity and/or a saturation amount of charges in the photoelectric conversion unit may be improved. The pixel includes the differential amplifier and the transistors which have the same conductivity type. Since a single conductivity type of a well may be provided in the pixel, the fill factor of the pixel, which is a ratio of a region that the photoelectric conversion unit occupies to a region allocated to a single pixel, may be improved. As a result, sensitivity and/or a saturation amount of charges in the photoelectric conversion unit may be improved.

The improvement in sensitivity and/or a saturation amount of charges may be especially beneficial to one or more embodiments of a photoelectric conversion device including the pixels each of which includes the differential amplifier. Since the differential amplifier includes two input transistors, the number of transistors included in the pixel apt to be increased. Thus, the fill factor of the pixel may be efficiently improved.

A photoelectric conversion device will be described. In the photoelectric conversion device, a pixel includes different types of transistors. For example, the pixel includes N-type channel transistors for readout switches or voltage signal convertor, and P-type channel transistors for a current mirror circuit.

The pixel including different types of transistors may be provided with different types of wells. The N-type channel transistor is provided in the P-type well, and P-type channel transistor in the N-type well. A PN junction is formed at the interface of the two wells which have different conductivity types. A depletion region extends from the PN junction into each of the two wells. The inventor has noted that, in case the transistor or a part thereof is provided in the depletion region, a leakage may occur in the transistor. Accordingly, the transistor may be provided at a distance from the PN junction. As described above, the two different types of wells may generate a dead space where the transistors are not provided. Thus, sensitivity and/or a saturation amount of charges may deteriorate.

In the following detailed description, for purposes of explanation, numerous specific details are set forth in order to provide a thorough understanding of the disclosed embodiments. These embodiments may have the above mentioned features. It will be apparent, however, that one or more embodiments may be practiced without these specific details. In other instances, well-known structures and devices are schematically shown in order to simplify the drawings. One disclosed feature of the embodiments may be described as a process which is usually depicted as a timing diagram. A timing diagram may illustrate the timing relationships of several entities, such as signals, events, etc. Although a timing diagram may describe the operations as a sequential process, some operations may be performed in parallel or concurrently. In addition, unless specifically stated, the order of the operations or timing instants may be re-arranged. Furthermore, the timing or temporal distances may not be scaled or depict the timing relationships in exact proportions.

In the following embodiments, an electron is used as a signal charge. In other embodiments, a hole may be used as a signal charge, and the conductivity type of the elements may be inverted.

First Exemplary Embodiment

FIG. 1 illustrates an equivalent circuit of a photoelectric conversion device according to one or more embodiments. The photoelectric conversion device includes a plurality of pixels, a current mirror circuit, a current to voltage convertor, a voltage signal storing portion, an output portion, a vertical scanning circuit and a horizontal scanning circuit. In each of the pixels, incident light may be converted into a charge. The vertical scanning circuit provides the pixels with drive signals. In accordance with the drive signals, a current signal corresponding to the amount of charges generated by the photoelectric conversion unit is output from the pixel. The current signal from the pixel is input to the current to voltage convertor via the current mirror circuit. The current to voltage convertor converts the current signal, which is output from the pixel, into a voltage signal. The voltage signal storing portion stores the voltage signal, which is converted from the current signal. According to drive signals the horizontal scanning circuit provides, the voltage signal stored by the storing portion is read out to the output portion. The output portion output the voltage signal to the outside of the device.

The pixel includes a differential amplifier that outputs a current signal. The transistors included in the pixel have the same conductivity type.

Each part of the photoelectric conversion device of the present embodiment will be described in detail. The plurality of pixels 101 are arranged so as to form a pixel array including three rows and three columns. The number of the pixels 101 is not limited. For example, the plurality of pixels 101 are arranged so as to form a pixel array including more than 1000 rows and more than 1500 columns. In another case, the plurality of pixels 101 may be arranged in a line so as to form a line sensor.

Signals from the pixels 101 included in a single pixel column may be processed in common circuitry. In the following description, exemplary one of the pixel columns will be explained. The other pixel columns may have the same structure, configuration and/or circuitry as the exemplary one.

The pixel 101 includes at least a photoelectric conversion unit and a pixel amplification unit. Incident light may be converted into a charge by the photoelectric conversion unit. The pixel amplification unit may output a current signal corresponding to the amount of charges generated by the photoelectric conversion unit. Thus, the pixel 101 may be a signal source configured to output a current signal. The pixel 101 includes OUT node, via which the current signal from the pixel 101 is output. The pixel 101 may further include a BIAS node, via which a bias current is provided from a bias current source, and a plurality of nodes (PTX node, PRES node and PSEL node), via which drive signals are provided. The detailed structure of the pixel 101 will be described later.

The BIAS node of the pixel 101 is electrically connected to the bias current source 102. A plurality of the pixel 101 may be electrically connected to the common bias current source 102. For example, the pixels 101 included in a single pixel column are electrically connected to the common bias current source 102. In another case, a bias current source 102 may be provided for each of the pixels 101 in the pixel column.

The PTX node, the PRES node and the PSEL node are electrically connected to the vertical scanning circuit 103. The vertical scanning circuit 103 may provide a common drive signal for the pixels 101 included in a single pixel row. Further, the vertical scanning circuit 103 may provide the pixels included in different rows from each other with independent drive signals. According to the drive signals the vertical scanning circuit provides, the signals are read out from the pixels 101 on the pixel row basis.

The OUT node of the pixel 101 is electrically connected to a first output line 104. The OUT nodes of a plurality of the pixels 101 may be electrically connected to the common first output line 104. For example, the OUT nodes of the pixels 101 included in a single pixel column are electrically connected to the common first output line 104. Thus, the current signals from the plurality of the pixels 101 may be output to the first output line 104.

The first output line 104 is electrically connected to the current mirror circuit. An output node of the current mirror circuit is electrically connected to a second output line 107. The current mirror circuit includes an input-side transistor 105 and an output-side transistor 106. The input-side and output-side transistors 105, 106 are P-type channel MOS (Metal Oxide Semiconductor) transistors. The gate and the drain of the input-side transistor 105 are shorted. The source of the input-side transistor 105 is electrically connected to a power source line. The power source line may provide the source of the input-side transistor 105 with a power source voltage VDD. The gate of the output-side transistor 106 is electrically connected to the gate of the input-side transistor 105. The source of the output-side transistor 106 is electrically connected to a power source line. The power source line may provide the source of the output-side transistor 106 with a power source voltage VDD. The first output line 104 is electrically connected to the drain of the input-side transistor 105 and the gates which are shorted to the drain of the input-side transistor 105. The drain of the output-side transistor 106 is electrically connected to the second output line 107.

In the current mirror circuit, a current running through the input-side transistor 105 may be mirrored in the output-side transistor 106. In other words, the current mirror circuit may output a current signal (a mirrored current signal) corresponding to the current signal at the first output line 104 into the second output line 107. The current mirror circuit may output the mirror current signal which is amplified or attenuated with respected to the current signal at the first output line 104. The amplification (or attenuation) factor may be determined according to a ratio of the sizes of the input and output-side transistors 105, 106. For example, in a case that the input and output-side transistors 105, 106 have the substantially same channel length, the amplification (or attenuation) factor may be the ratio of the channel widths.

The second output line 107 is electrically connected to the current to voltage convertor. The current to voltage convertor includes an operational amplifier 108 and a conversion resistor 109. The second output line 107 is electrically connected a first input node 110 of the operational amplifier 108. The second input node 111 of the operational amplifier 108 is electrically connected to a reference voltage line. The reference voltage line may provide a reference voltage VREF for the second input node 111 of the operational amplifier. The first input node 110, which is electrically connected to the second output line 107, is electrically connected to an output node 112 of the operational amplifier 108 via the conversion resistor 109. One node of the conversion resistor 109 is connected to the second output line 107 and the first input node 110 of the operational amplifier 108. And, the other node of the conversion resistor 109 is connected to the output node 112 of the operational amplifier.

The operational amplifier may work such that its two input nodes 110 and 111 have the same voltage. Since the reference voltage VREF is provided for the second input node 111, the voltage of the first input node 110 may be set in the reference voltage VREF. That is, the voltage of the one node of the conversion resistor 109 may be the reference voltage VREF. Accordingly, the voltage of the other node of the conversion resistor 109 may be determined by a voltage drop at the conversion resistor 109, which is give by its resistance and amplitude of a current running through the conversion resistor 109. Since the operational amplifier has a high input impedance, all or most of the current at the second output line 107 may flow into the conversion resistor 109. Hence, a voltage corresponding to the amplitude of the current at the second output line 107 may emerge at the output node 112 of the operational amplifier 108. As described above, the current signal from the second output line 107 may be converted into the voltage signal by the current to voltage convertor.

The conversion resistor 109 may have variable resistance. When the resistance of the conversion resistor 109 varies, a conversion gain in the conversion from the current signal to the voltage signal may vary. High resistance may result in a high gain. For a conversion of a current signal with small amplitude, the resistance of the conversion resistor 109 may be controlled to be high. A high gain may reduce an influence caused by a noise generated in the subsequent stages. For a conversion of a current signal with large amplitude, the resistance of the conversion resistor 109 may be controlled to be low. When a low gain is used, a wide dynamic range may be obtained.

Although the gain at the current to voltage conversion varies, the amplitude of the current running through the conversion resistance may be kept to be substantially constant. Hence, the power consumption may be kept substantially constant. Therefore, the power consumption may be reduced as compared with the case where the amplitude of the current signal is amplified for a high gain.

The output node 112 of the current to voltage convertor is electrically connected to the voltage signal storing portion. The voltage signal storing portion includes a first switch 113, a second switch 114, a CTN capacitor 115 and a CTS capacitor 116. The first switch 113 is provided in an electrical path between the output node 112 of the operational amplifier 108 and one node of the CTN capacitor 115. The gate of the first switch 113 is electrically connected to a PTN node. The other node of the CTN capacitor 115 may be provided with a ground voltage GND. The second switch 114 is provided in an electrical path between the output node 112 of the operational amplifier 108 and one node of the CTS capacitor 116. The gate of the second switch 114 is electrically connected to a PTS node. The other node of the CTS capacitor 116 may be provided with the ground voltage GND.

The PTN node may be provided with a drive signal for controlling the first switch 113 to be turned on or off. The PTS node may be provided with a drive signal for controlling the second switch 114 to be turned on or off. When the first switch 113 turns on, the voltage signal at the output node 112 of the operational amplifier 108 may be stored in the CTN capacitor 115. When the second switch 114 turns on, the voltage signal at the output node 112 of the operational amplifier 108 may be stored in the CTS capacitor 116. As described above, the voltage signal store portion may store the voltage signal, which has been converted from the current signal by the current to voltage convertor.

The voltage signal store portion is electrically connected to the output portion. The output portion includes a third switch 117, a fourth switch 118 and an output amplifier 121. The CTN capacitor 115 is electrically connected to the third output line 119 via the third switch 117. The CTS capacitor 116 is electrically connected to the fourth output line 120 via the fourth switch 118. The gates of the third and fourth switches are electrically connected to the horizontal scanning circuit 122. The third and fourth output lines 119 and 120 are electrically connected to the output amplifier 121. The output node of the output amplifier may be electrically connected to a subsequent signal processing unit (not shown).

The horizontal scanning circuit 122 may provide drive signals for controlling respectively the third and fourth switches 117 and 118 to be turned on or off. When the third switch 117 turns on, the voltage signal stored in the CTN capacitor 115 may be read out into the third output line 119 by capacitive division of charges. When the fourth switch 118 turns on, the voltage signal stored in the CTS capacitor 116 may be read out into the fourth output line 120 by capacitive division of charges. The output amplifier 121 may amplify the voltage signals at the third and fourth output lines 119 and 120 respectively. In another case, the output amplifier 121 may be a differential processing unit. For example, the output amplifier 121 may output a differential signal between the voltage signals at the third and fourth output lines 119 and 120. As above described, the output portion may output the voltage signal stored in the voltage signal storing portion.

Here, the capacitive division of charges will be described in detail. There provided are a first capacitor and a second capacitor which is connectable to the first capacitor via a switch. The capacitor may be a capacitive node. When the first capacitor is connected to the second capacitor, charges in the first capacitor may be divided into the first and second capacitor. In another aspect, the voltage of the first capacitor may be converted into a voltage corresponding to the composite capacitance of the first and second capacitors. For example, the voltage of the CTS capacitor 116 is converted into a voltage corresponding to the composite capacitance of the CTS capacitor 116 and the fourth output line 120.

As described above, the current signal from the pixel, which is a signal source, is converted into the voltage signal, and the converted voltage signal is output to the outside.

Hereinafter, an exemplary structure of the pixel 101 will be described in detail. The pixel 101 includes at least the photoelectric conversion unit and the pixel amplification unit. Incident light may be converted into a charge by the photoelectric conversion unit. The pixel amplification unit may output a current signal corresponding to the amount of charges generated by the photoelectric conversion unit.

Figure 2:
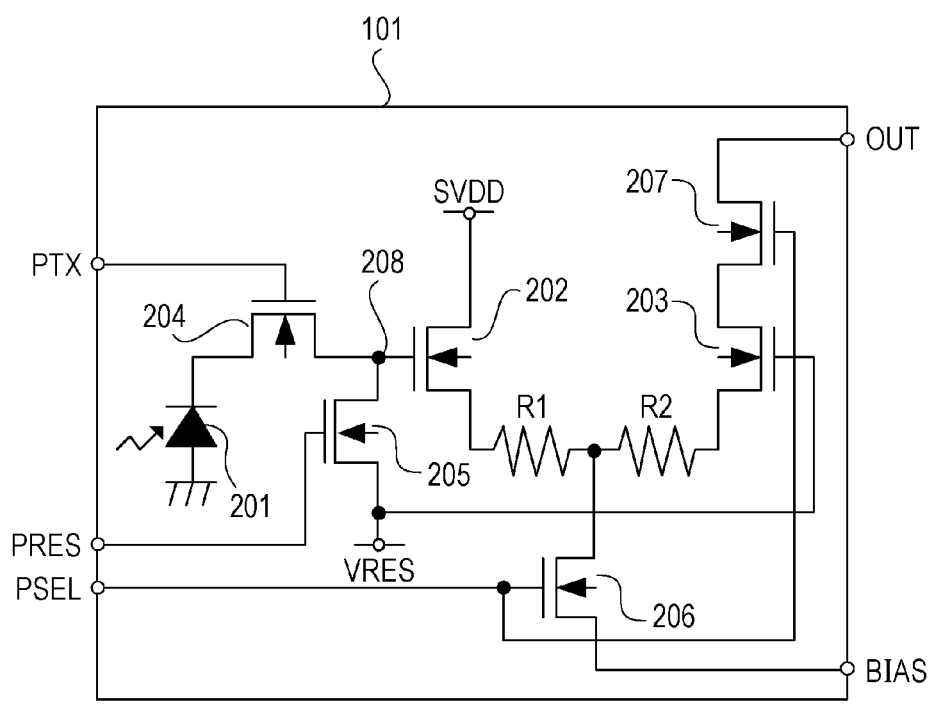
FIG. 2 illustrates an equivalent circuit of an exemplary pixel of an exemplary embodiment.

FIG. 2 illustrates an equivalent circuit of the pixel 101 according to one or more embodiments. The photoelectric conversion unit may be, for example, a photodiode (below, PD) 201. The pixel amplification unit may be, for example, a differential amplifier. The differential amplifier includes a first input transistor 202 and a second input transistor 203. The pixel 101 may include a transfer transistor 204, a reset transistor 205, a first selection transistor 206, a second selection transistor 207, a resistor R1 and a resistor R2.

The anode of the PD 201 is provided with a ground voltage GND. The cathode of the PD 201 is electrically connected to a node 208 via the transfer transistor 204. The transfer transistor 204 transfers the charges generated at the PD 201 to the node 208.

The gate of the first input transistor 202 is electrically connected to the node 208. The gate of the first input transistor 202 is a first input node of the differential amplifier. The voltage at the gate of the first input transistor 202 may be a voltage corresponding to the amount of charges which are transferred to the node 208. In another aspect, the transferred charges are converted into a voltage signal at the node 208. The drain of the first input transistor 202 is electrically connected to the power source line. The power source line may provide the drain of the first input transistor 202 with a power source voltage SVDD. The power source voltage SVDD may be the same as the power source voltage VDD which is provided for the current mirror circuit. In another case, the power source voltage SVDD and the power source voltage VDD may be different from each other. The source of the first input transistor 202 is electrically connected to the drain of the first selection transistor 206 via the resistor R1.

The gate of the second input transistor 203 is electrically connected to a reset voltage line. The gate of the second input transistor 203 is a second input node of the differential amplifier. The reset voltage line may provide the gate of the second input transistor 203 with a reset voltage VRES. The source of the second input transistor 203 is electrically connected to the drain of the first selection transistor 206 via the resistor R2. The drain of the second input transistor 203 is electrically connected to the source of the second selection transistor 207. The reset voltage line includes a conductive member and may be a reset voltage providing unit.

The node 208 is electrically connected to the reset voltage line via the reset transistor 205. The reset transistor 205 controls an electrical connection between the node 208 and the reset voltage line. When the reset transistor 205 is turned on, the node 208 is provided with the reset voltage VRES. In other words, the reset transistor 205 may reset the voltage of the first input node of the differential amplifier.

The drain of the first selection transistor 206 is electrically connected to the resistor R1 and the resistor R2. The source of the first selection transistor 206 is electrically connected to the BIAS node. The drain of the second selection transistor 207 is electrically connected to the OUT node. The BIAS node is electrically connected to the bias current source 102 and the OUT node is electrically connected to the first output line 104.

The gate of the transfer transistor 204 is electrically connected to the PTX node. The gate of the reset transistor 205 is electrically connected to the PRES node. The gates of the first and second selection transistors 206, 207 are electrically connected to the PSEL node. The vertical scanning circuit 103 provides each gate of the transistors with a drive signal for controlling each of the transistors to be turned on or off.

The first input transistor 202 and the second input transistor 203 may form a differential pair. That is, the sources of the two transistors 202, 203 are electrically connected to the common bias current source 102. A drain current of the second input transistor 203, which is the current signal to be output from the pixel 101, corresponds to the difference of the voltages at the gates of the two transistors 202, 203. Thus, the differential pair of the first input transistor 202 and the second input transistor 203 is included in the differential amplifier.

The first and second selection transistors 206, 207 may select a pixel 101 which outputs the current signal, out of the plurality of the pixels 101. In detail, when both of the first and second selection transistors 206, 207 are on, the differential amplifier may output the current signal via the OUT node.

In FIG. 2, the first and second selection transistors 206, 207 are provided for selection of the pixel. Providing the first selection transistor 206 may reduce power consumption by cutting the current when the pixel is in a non-selective state. Providing the second selection transistor 207 may reduce the parasitic capacitance of the first output line 104.

One of the first and second selection transistors 206, 207 may be omitted. In case the second selection transistor 207 is omitted, accuracy of the current signal may be improved because the symmetrical characteristic of the differential amplifier may be improved.

Further, a third selection transistor may be provided in an electrical path between the drain of the first input transistor 202 and the power source line. In case both of the second and third selection transistors are provided, the accuracy of the current signal may be improved because the symmetrical characteristic of the differential amplifier may be improved.

In another case, both of the first and second selection transistors 206, 207 may be omitted. In this case, the pixel 101 may be set in non-selective state by providing the gate of the first and second input transistors 202, 203 with a voltage such that both transistors 202, 203 are turned off. For example, such voltage may be provided from the reset voltage line. In case both of the first and second selection transistors 206, 207 are omitted, the fill factor of the pixel may be improved by the reduction of the number of the pixel transistors.

The transfer transistor 204 may be provided in one or more embodiments. In other embodiments, the transfer transistor 204 may be omitted. In case the transfer transistor 204 is omitted, the fill factor of the pixel may be improved by reduction of the number of the pixel transistors.

Hereinafter, another exemplary structure of the pixel 101 will be described in detail. The pixel 101 includes at least the photoelectric conversion unit and the pixel amplification unit.

Incident light may be converted into a charge by the photoelectric conversion unit. The pixel amplification unit may output a current signal corresponding to the amount of charges generated by the photoelectric conversion unit.

Figure 3:
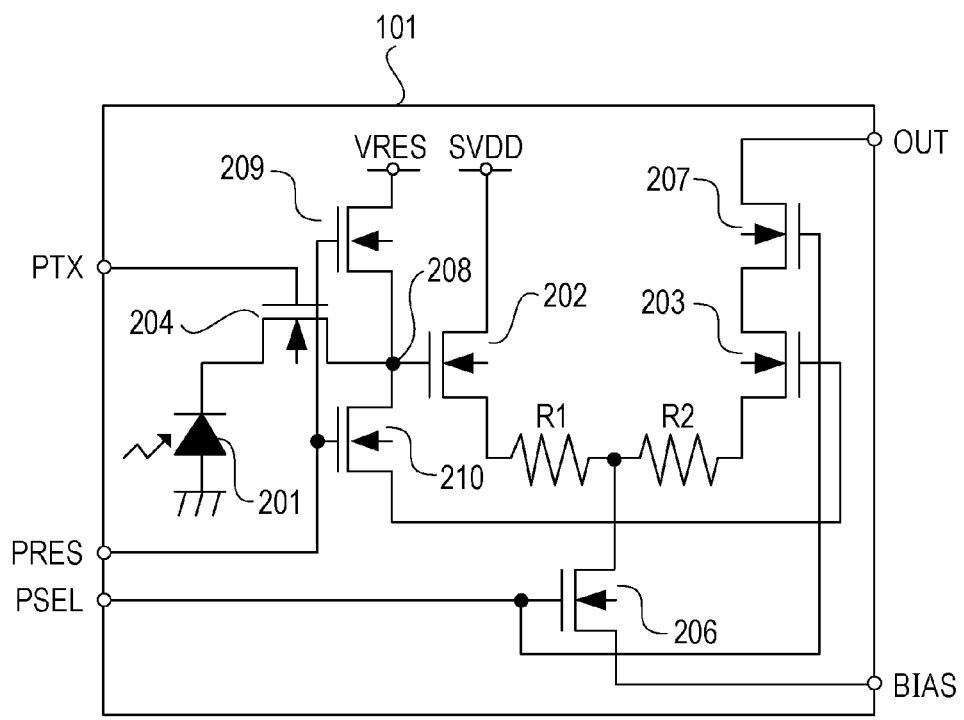
FIG. 3 illustrates an equivalent circuit of an exemplary pixel of an exemplary embodiment.

FIG. 3 illustrates an equivalent circuit of the pixel 101 of the present embodiment. The photoelectric conversion unit may be, for example, a photodiode (below, PD) 201. The pixel amplification unit may be, for example, a differential amplifier. The differential amplifier includes a first input transistor 202 and a second input transistor 203. The pixel 101 may include a transfer transistor 204, a reset transistor 209, a connection transistor 210, a first selection transistor 206, a second selection transistor 207, a resistor R1 and a resistor R2.

The anode of the PD 201 is provided with a ground voltage GND. The cathode of the PD 201 is electrically connected to a node 208 via the transfer transistor 204. The transfer transistor 204 may transfer the charges generated at the PD 201 to the node 208.

The gate of the first input transistor 202 is electrically connected to the nod 208. The gate of the first input transistor 202 is a first input node of the differential amplifier. The voltage at the gate of the first input transistor 202 may be a voltage corresponding to the amount of charges which are transferred to the node 208. In another aspect, the transferred charges are converted into a voltage signal at the node 208. The drain of the first input transistor 202 is electrically connected to the power source line. The power source line may provide the drain of the first input transistor 202 with a power source voltage SVDD. The power source voltage SVDD may be the same as the power source voltage VDD which provided for the current mirror circuit. In another case, the power source voltage SVDD and the power source voltage VDD may be different from each other. The source of the first input transistor 202 is electrically connected to the drain of the first selection transistor 206 via the resistor R1.

The gate of the second input transistor 203 is electrically connected to a source of the connection transistor 210. The gate of the second input transistor 203 is a second input node of the differential amplifier. The source of the second input transistor 203 is electrically connected to the drain of the first selection transistor 206 via the resistor R2. The drain of the second input transistor 203 is electrically connected to the source of the second selection transistor 207.

The node 208 is electrically connected to the reset voltage line via the reset transistor 209. The reset transistor 209 controls an electrical connection between the node 208 and the reset voltage line. When the reset transistor 209 is turned on, the node 208 is provided with the reset voltage VRES. In other words, the reset transistor 209 may reset the voltage of the first input node of the differential amplifier.

The connection transistor 210 is provided in an electrical path between the gate of the first input transistor 202 (the node 208) and the gate of the second input transistor 203. In other words, one of the source and the drain of the connection transistor 210 is electrically connected to the gate of the first input transistor 202 and the other to the gate of the second input transistor 203. When the connection transistor is turned on, the gate of the first input transistor 202 and the gate of the second input transistor 203 are shorted to each other. When both of the reset transistor 209 and the connection transistor 210 are turned on, the reset voltage VRES may be provided for the gate of the second input transistor 203 via the reset transistor 209 and the connection transistor 210.

The drain of the first selection transistor 206 is electrically connected to the resistor R1 and the resistor R2. The source of the first selection transistor 206 is electrically connected to the BIAS node. The drain of the second selection transistor 207 is electrically connected to the OUT node. The BIAS node is electrically connected to the bias current source 102 and the OUT node is electrically connected to the first output line 104.

The gate of the transfer transistor 204 is electrically connected to the PTX node. The gate of the reset transistor 209 and the gate of the connection transistor 210 are electrically connected to the PRES node. The gates of the first and second selection transistors 206, 207 are electrically connected to the PSEL node. The vertical scanning circuit 103 provides each gate of the transistors with a drive signal for controlling each of the transistors into on or off.

In FIG. 3, the gate of the reset transistor 209 and the gate of the connection transistor 210 are electrically connected to each other. In another case, the gate of the reset transistor 209 and the gate of the connection transistor 210 may be provided with independent drive signals. In this case the reset transistor 209 and the connection transistor 210 may be controlled independently from each other. For example, when the both of the reset transistor 209 and the connection transistor 210 are on, the reset transistor 209 is firstly turned off, thereafter the connection transistor 210 is turned off.

The first input transistor 202 and the second input transistor 203 may form a differential pair. That is, the sources of the two transistors 202, 203 are electrically connected to the common bias current source 102. A drain current of the second input transistor 203, which is the current signal to be output from the pixel 101, corresponds to the difference of the voltages at the gates of the two transistors 202, 203. Thus, the differential pair of the first input transistor 202 and the second input transistor 203 is included in the differential amplifier.

The first and second selection transistors 206, 207 may select a pixel 101 which outputs the current signal, out of the plurality of the pixels 101. In detail, when both of the first and second selection transistors 206, 207 are turned on, the differential amplifier may output the current signal via the OUT node.

In FIG. 3, a second reset transistor may be provided in an electrical path between the gate of the second input transistor 203 and the reset voltage line. In this case, the accuracy of the current signal may be improved because the symmetrical characteristic of the differential amplifier may be improved.

Figure 4:
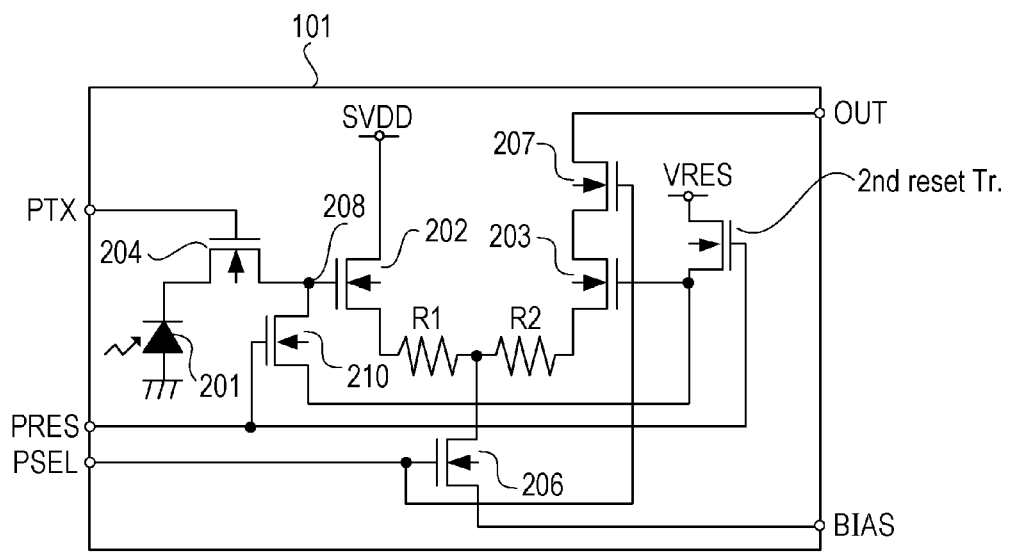
FIG. 4 illustrates an equivalent circuit of an exemplary pixel of an exemplary embodiment.

Other exemplary structure of the pixel 101 will be described in detail. FIG. 4 illustrates an equivalent circuit of the pixel 101 of the present embodiment. The reset transistor 209 in FIG. 3 is omitted in FIG. 4. Two transistors (the transfer transistor 204 and the connection transistor 210) are connected to the gate of the first input transistor 202. Two transistors (the second reset transistor and the connection transistor 210) are connected to the gate of the second input transistor 203. Accordingly, since the same number of the transistors is connected to each of the first and second input node of the differential amplifier, accuracy of the current signal may be improved.

In FIGS. 3 and 4, the first and second selection transistors 206, 207 are provided for selection of the pixel. Providing the first selection transistor 206 may reduce power consumption by cutting the current when the pixel is in a non-selective state. Providing the second selection transistor 207 may reduce the parasitic capacitance of the first output line 104.

One of the first and second selection transistors 206, 207 may be omitted. In case the second selection transistor 207 is omitted, the accuracy of the current signal may be improved because the symmetrical characteristic of the two input nodes of the differential amplifier may be improved.

Further, a third selection transistor may be provided in an electrical path between the drain of the first input transistor 202 and the power source line. In case both of the second and third selection transistors are provided, the accuracy of the current signal may be improved because the symmetrical characteristic of the differential amplifier may be improved.

In another case, both of the first and second selection transistors 206, 207 may be omitted. In this case, the pixel 101 may be set in non-selective state by providing the gate of the first and second input transistors 202, 203 with a voltage such that the both transistors 202, 203 are turned into off. For example, such voltage may be provided from the reset voltage line. In case both of the first and second selection transistors 206, 207 are omitted, the fill factor of the pixel may be improved by reduction of the number of the pixel transistors.

Further, the pixel configuration in FIG. 3 may change such that a charge of the PD 201 may be transferred to the gate of the second input transistor 203. In other words, the transfer transistor may be provided not in an electrical path between the PD 201 and the gate of the first input transistor 202, but in an electrical path between the PD 201 and the gate of the second input transistor 203. In this case, since the same number of the transistors is connected to each of the first and second input node of the differential amplifier, accuracy of the current signal may be improved. Each gate of the first and second input transistors 202, 203 may be set in an electrically floating state after the reset voltage VRES is provided. Accordingly, the current signal corresponding to the difference of the voltages between the two input nodes may be output regardless of which one of the two input node the charge of the PD 201 is transferred to.

In FIGS. 2, 3 and 4, the electron is used as the signal charge, and is transferred to the node 208, which is the gate of the first input transistor 202. The transfer of the electron may lower the voltage of the node 208. The more the charges are transferred, the lower the voltage of the node 208 may become. Since, in the bright situation, a large amount of charges may be transferred to the node 208, the voltage of the node 208 may be low. Since the input transistors 202, 203 have N-type channels, the amplitude of the current signal may be larger in the bright situation than in the dark situation. In another case, the electron of the PD 201 may be transferred to the gate of the second input transistor 203. In this case, the more the charges are transferred, the smaller the amplitude of the current signal may become. The dark situation may include a situation where the voltage of the node 208 has been reset and charges are not transferred to the node 208.

In FIGS. 3 and 4, provided is the connection transistor 210 which connected to the two input nodes of the differential amplifier. Accordingly, the reset noise, which is generated when the input nodes are reset, may be substantially equally divided into the two input nodes. Since the divided noises may cancel each other by the differential amplification, noises in the current signal may be reduced.

As shown in FIG. 1, in one or more embodiments, the circuit for reading out the current signal corresponding to the amount of charges generated in the photoelectric conversion unit into the first output line 104, which is illustrated in each of FIGS. 2, 3 and 4, is repeatedly or periodically arranged. That is, the circuit illustrated in any one of FIGS. 2, 3 and 4 is provided for each of the plurality of the photoelectric conversion units. In other words, transistors included in the readout portion are repeatedly, or periodically, arranged so as to corresponding to a plurality of the pixels whose signals are output to the common output line (the first output line 104).

In other embodiments, the circuit illustrated in any one of FIGS. 2, 3 and 4 may be repeatedly, or periodically, provided every two or more of the plurality of the photoelectric conversion units. In detail, charges of two photoelectric conversion units may be transferred into the gate of the first input transistor 202, which is commonly provided for the two photoelectric conversion units. In this case, a plurality of the photoelectric conversion units may share the transistors other than the transfer transistor. Therefore the fill factor of the pixel may be improved by reduction of the number of the pixel transistors.

In the present embodiment, the transistors each of which is repeatedly, or periodically, provided so as to correspond to the plurality of the photoelectric conversion units may have the same conductivity type. Specifically, the first and second input transistors 202, 203, the transfer transistor 204, the reset transistor 205, the first and second selection transistors 206, 207, the reset transistor 209 and the connection transistor 210 are respectively N-type channel MOS transistors. In this case, since a single conductivity type of a well may be provided in the pixel 101, the fill factor of the pixel, which is a ratio of a region that the photoelectric conversion unit occupies to a region of a single pixel, may be improved. Therefore, sensitivity and/or a saturation amount of charges may be improved.

In the present embodiment, the electron may be used as the signal charge, and the N-type channel transistors may be provided in the pixel. In this case, since the photoelectric conversion unit and the transistors may be provided in the same well, the fill factor of the pixel may be improved. Therefore, sensitivity and/or a saturation amount of charges may be improved. When a hole is used as the signal charge, P-type channel transistors may be used.

An element which is not repeatedly arranged but is provided commonly for a plurality of the photoelectric conversion units may be included in the circuit for reading out the current signal corresponding to the amount of charges generated in the photoelectric conversion unit into the first output line 104. For example, the bias current source 102 in FIG. 1 may be included in the circuit for reading out, or the readout portion, because it may drive the differential amplifier by providing the bias current. In FIG. 1, the bias current source 102, however, is provided for each of the plurality of the pixel rows. Thus, the bias current source 102 is not an element which is repeatedly, or periodically, arranged so as to correspond to the plurality of the photoelectric conversion units whose signals are to be output to the common output line (the first output line 104). Thus, the bias current source 102 may include a P-type channel transistor.

Figure 5:
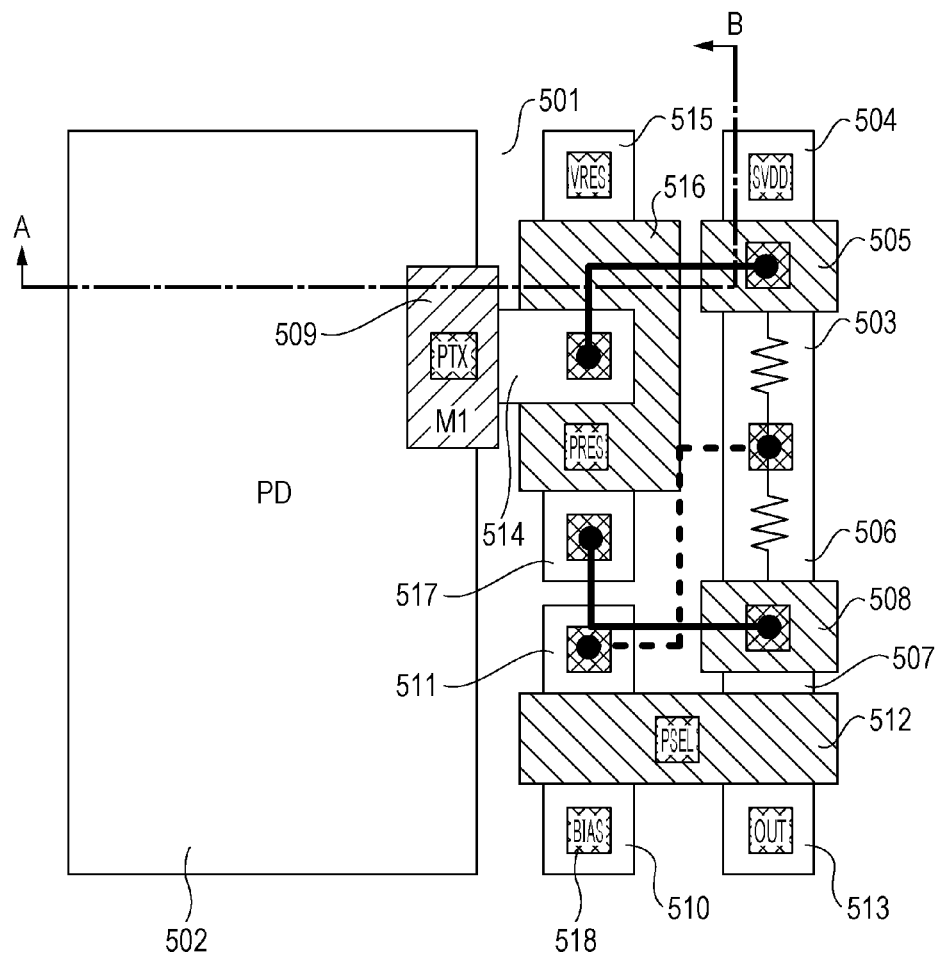
FIG. 5 is a schematic illustration of the planar structure of an exemplary pixel of an exemplary embodiment.

FIG. 5 is a schematic illustration of the planar structure of the pixel illustrated in FIG. 3. The pixel circuit may be provided in a semiconductor substrate, such as a silicon substrate or the like. The semiconductor substrate includes an active region, which is defined by an element isolation portion 501. Elements, such as photodiodes, transistors and resistors, may be provided in the active region.

The element isolation portion 501 may include an isolation structure such as LOCOS (Local Oxidation of Silicon) or STI (Shallow Trench Isolation). In another case, the element isolation portion 501 may include an isolation structure using a PN junction. The element isolation portion 501 may electrically isolate the PD and the transistors.

In the present embodiment, the MOS transistors are used in the pixel. Each transistor has a source region, a drain region, a gate electrode and a channel region. The source region, the drain region and the channel region are semiconductor regions provided in the semiconductor substrate. The gate electrode may be formed of a poly-silicon provided on the semiconductor substrate via an insulator film.

The PD 201 includes a semiconductor region 502. The first input transistor 202 may include semiconductor regions 503, 504 and a gate electrode 505 as the source, the drain and the gate. The second input transistor 203 may include semiconductor regions 506, 507 and a gate electrode 508 as the source, the drain and the gate. The semiconductor regions 503 and 506 may respectively form the resistors R1 and R2. The transfer transistor 204 may include a gate electrode 509 as the gate. The first selection transistor 206 may include semiconductor regions 510, 511 and a gate electrode 512 as the source, the drain and the gate. The second selection transistor 207 may include semiconductor regions 507, 513 and the gate electrode 512 as the source, the drain and the gate. The reset transistor 209 may include semiconductor regions 514, 515 and a gate electrode 516 as the source, the drain and the gate. The connection transistor 210 may include the semiconductor regions 514, 517 and the gate electrode 516 as the source, the drain and the gate.

Contact plugs 518 are provided for the gate electrode and the semiconductor regions each of which forms the source or the drain. The semiconductor regions and the gate electrode may be connected to conductive members included in interconnections via the contact plugs 518. For example, the semiconductor region 514 and the gate electrode 505 are connected to each other by the interconnection, and form the node 208 in FIG. 3.

As shown in FIG. 5, two nodes, which are supposed to be electrically connected to each other, may be formed of a common semiconductor region or a common gate electrode. For example, since the drain of the second input transistor 203 may be connected to the source of the second selection transistor 207, both nodes are formed of the semiconductor region 507. In another case, however, the two nodes may be formed of two separated semiconductor regions. The gate of the reset transistor 209 and the gate of the connection transistor 210 may be formed of two separated gate electrodes. Although, in FIG. 8, the resistors R1 and R2 are formed of the semiconductor regions 503 and 506, the resistors R1 and R2 may be thin film resistors formed of poly-silicon as the like.

As shown in FIG. 5, the structure from the gate electrode 505 to the gate electrode 508 may have symmetry with respect to a line. In this case, the accuracy of the current signal may be improved because the symmetrical characteristic of the differential amplifier may be improved.

Figure 6:
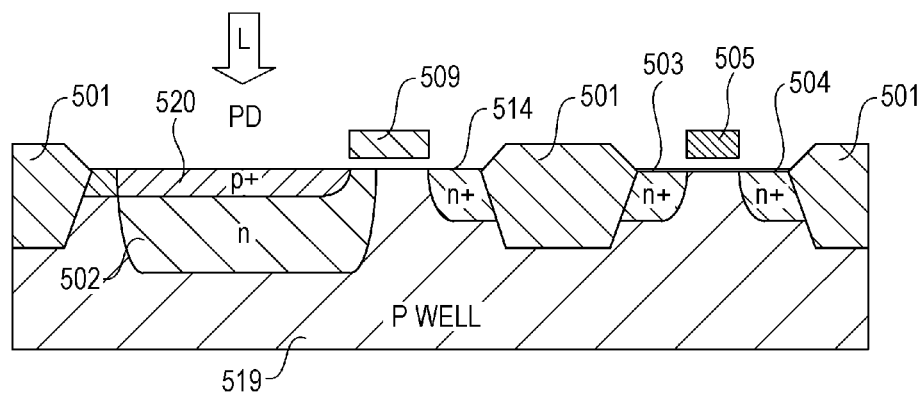
FIG. 6 is a schematic illustration of the cross-sectional structure of an exemplary pixel of an exemplary embodiment.

FIG. 6 is a schematic illustration of an exemplary cross-sectional structure taken along a line A-B in FIG. 5. The PD 201, the transfer transistor 204 and the first input transistor 202 are exemplarily illustrated in FIG. 6. The same reference symbol is used to indicate elements in FIG. 6 and FIG. 5 which perform the same or a similar function, and detailed descriptions of the elements are not repeated.

The PD 201 includes an N-type semiconductor region 502. The N-type semiconductor region 502 may accumulate generated charges therein. The first input transistor 202 may include N-type semiconductor regions 503 and 504 as the source and the drain. Accordingly, the first input transistor 202 may have an N-type channel. These N-type semiconductor regions may be provided in a P-type well 519. The P-type well 519 may be provided with the ground voltage GND.

The P-type well 519 may be a semiconductor region formed by diffusing or implanting impurities into the semiconductor substrate. In another case, the P-type well 519 may be formed by an epitaxial layer grown on the semiconductor substrate.

A P-type semiconductor region 520 is provided adjacent to the N-type semiconductor region 502 of the PD 201. The P-type semiconductor region 520 may be connected to the P-type well 519 and be provided with the ground voltage GND. The P-type semiconductor region 520 may reduce a noise caused by a dark current generated at the interface of the semiconductor substrate and an insulator.

Figure 9:
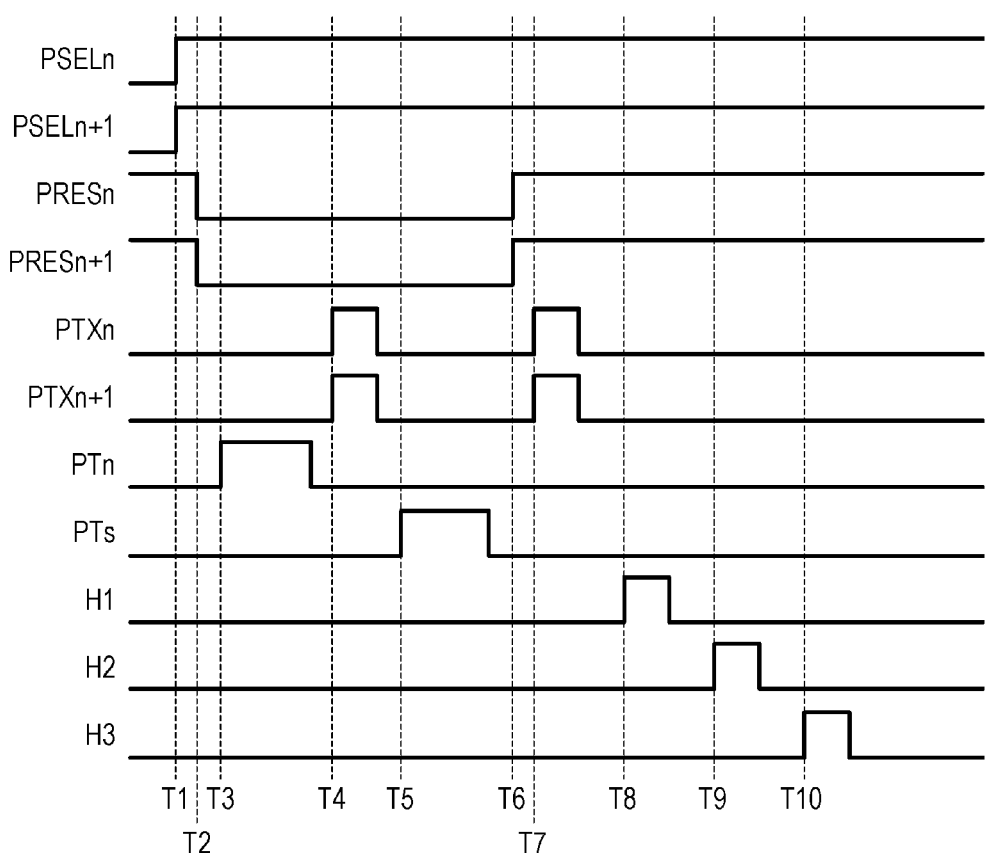
FIG. 9 is a timing chart of an exemplary operation for an exemplary embodiment.

In case the transistors which included in the pixel circuit have the same conductivity type, a single conductivity type of a well may be used in the pixel as shown in FIG. 9. Therefore, the fill factor of the pixel, which is a ratio of a region that the photoelectric conversion unit occupies to a region of a single pixel, may be improved. Therefore, sensitivity and/or a saturation amount of charges may be improved.

In the present embodiment, the PD 201 which accumulates electrons may be formed by providing N-type semiconductor region 502 in the P-type well 519. In this case, since the photoelectric conversion unit and the transistors may be provided in the same well, the fill factor of the pixel may be improved. Therefore, sensitivity and/or a saturation amount of charges may be improved. When hole is used as the signal charge, P-type channel transistors may be used, and vice versa.

If two wells having different conductive type from each other are provided, a PN junction may be formed between the two wells. In this case, the elements are provided with a distance from the PN junction in order to avoid the influence the electrical field caused by the PN junction may impose on.

As shown in FIG. 6, light may enter the semiconductor substrate in a direction indicated by reference symbol L. That is, the photoelectric conversion device illustrated in FIG. 6 is a front-side illuminated type.

Figure 7:
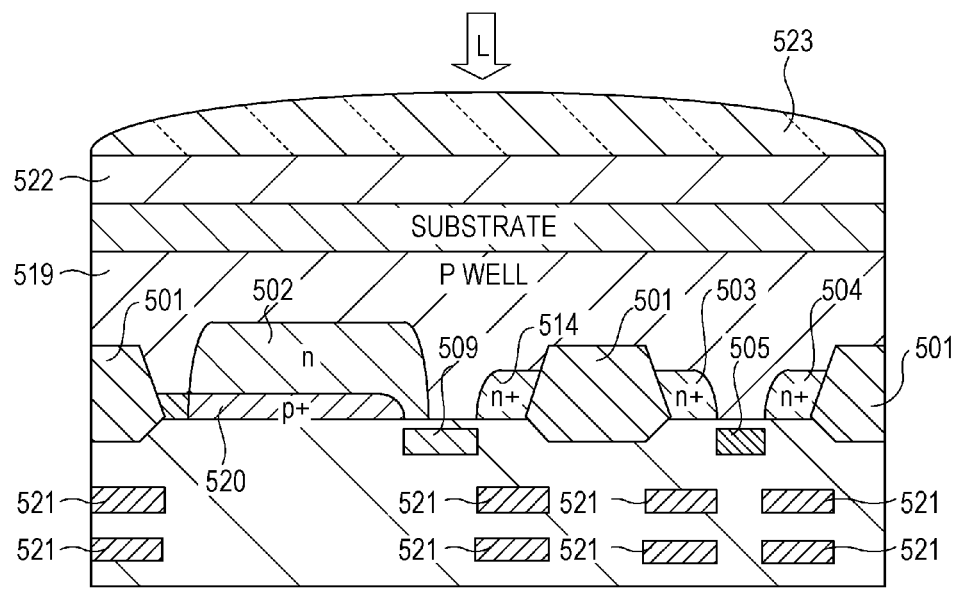
FIG. 7 is a schematic illustration of the cross-sectional structure of an exemplary pixel of an exemplary embodiment.

FIG. 7 is a schematic illustration of another exemplary cross-sectional structure taken along a line A-B in FIG. 5. The PD 201, the transfer transistor 204 and the first input transistor 202 are exemplarily illustrated in FIG. 7.

The photoelectric conversion device illustrated in FIG. 7 is a back-side illuminated type. In detail, light may enter the semiconductor substrate from a side (back side) opposite to a side (front side) on which the gate electrodes of the transistors are provided. The reference symbol L in FIG. 7 indicates a direction in which light may enter the semiconductor substrate.

The same reference symbol is used to indicate elements in FIG. 7 and FIG. 6 which perform the same or a similar function, and detailed descriptions of the elements are not repeated. A conductive member 521 included in an interconnection is shown in FIG. 7. Further, a color filter 522 and a lens 523 may be provided on the back side of the semiconductor substrate.

In the back-side illuminated type photoelectric conversion device, conductive members and gate electrodes, which may shield incident light, may be reduced on a side (back side) though which the incident light may enter the semiconductor substrate. Accordingly, sensitivity may be improved.

The photoelectric conversion device of the present embodiment may include a second semiconductor substrate. The second semiconductor substrate may include transistors in the circuit for reading out the current signal from the pixels or the signal processing circuit. The second semiconductor substrate may be provided on a first side of the conductive member 521, the first side being opposite to a second side of the conductive member 521 on which the PD 201 is provided. In another aspect of view, the (first) semiconductor substrate where the PD 201 is provided and the second semiconductor substrate where the transistors are provided may be arranged so as to face to each other with the conductive member included in the interconnection therebetween. In this case, the fill factor of the pixel may be improved by reduction of the number of the pixel transistors which are provided in the same semiconductor substrate as the PD 201.

Figure 8:
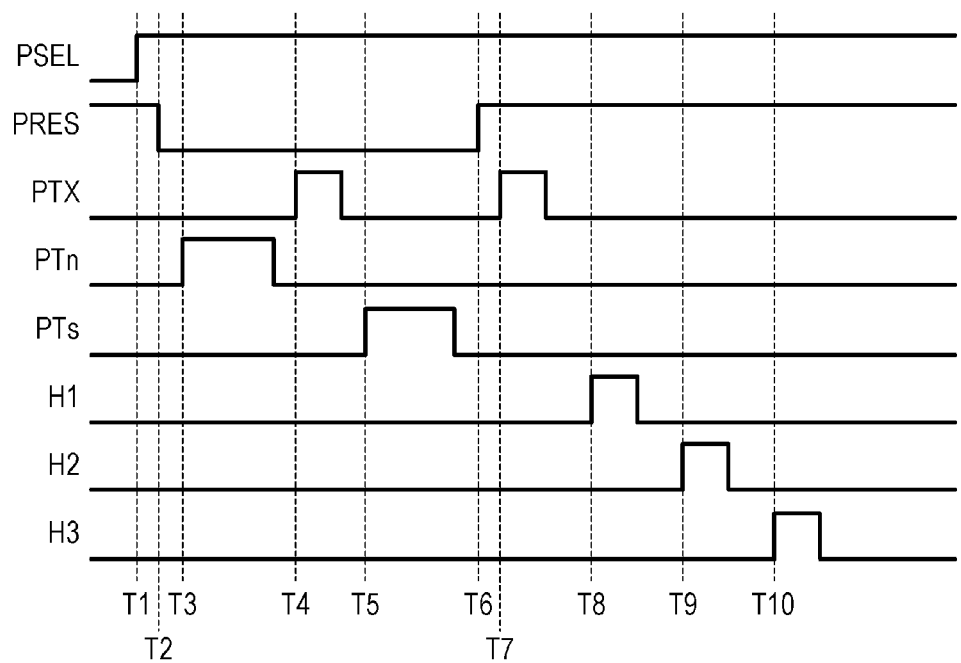
FIG. 8 is a timing chart of an exemplary operation for an exemplary embodiment.

Hereinafter, an exemplary operation for the photoelectric conversion device according to the present embodiment will be described. FIG. 8 is a timing chart of the drive signals. The drive signals PSEL, PRES, PTX, PTN and PTS, illustrated in FIG. 8, are respectively provided for the PSEL node, the PRES node, the PTX node, the PTN node and the PTS node, illustrated in FIG. 1. The drive signal H1 is provided for the gates of the third and fourth switches 117, 118 of the leftward pixel column in FIG. 1. The drive signal H2 is provided for the gates of the third and fourth switches 117, 118 of the middle pixel column in FIG. 1. The drive signal H3 is provided for the gates of the third and fourth switches 117, 118 of the rightward pixel column in FIG. 1.

Each of the drive signals may have at least two values which correspond to a high level and a low level. In analog circuits, the high level of the drive signal may turn on the corresponding transistor. The low level of the drive signal may turn off the corresponding transistor.

Before T1, the PRES is of a high level. The other drive signals are of low levels. At this time, the reset voltage VRES is provided for the node 208 and the gate of the second input transistor 203. Since the transfer transistor 204 is turned off in this period, charges generated by photoelectric conversion may be accumulated in the PD 201.

At T1, the PSEL turns into a high level, whereby the pixel may be selected. Thus, the current signal according to the voltage of the input node of the pixel amplification unit may be output via the OUT node.

At T2, the PRES turns into a low level, whereby the node 208 may become electrically floating. In the pixel illustrated in FIG. 3, the node 208 and the gate of the second input transistor 203 may become electrically floating.

At T3, the PTN turns into a high level. When the PTN is of a high level, the voltage signal converted from the current signal from the pixel may be stored in the CTN capacitor 115. At T3, the voltage of the input node (node 208) of the pixel amplification unit is the reset voltage VRES. Accordingly, a voltage signal corresponding to a current signal that the pixel outputs when in a state of being reset is stored in the CTN capacitor 115. The current signal that the pixel outputs when in a state of being reset, or the voltage signal converted therefrom, may contain a reset nose, which is generated when the reset transistor turns off. After a period passes since T3, the PTN turns into a low level.

At T4, the PTX turns into a high level, whereby the charge generated at PD 201 may be transferred to the node 208. At this time, the whole charges of the PD 201 may be transferred to the node 208. After a period passes since T4, the PTX turns into a low level.

By the transfer of the charges to the node 208, the voltage of the node 208 may change from the reset voltage VRES. The amount of the voltage change may be defined by the amount of the charges transferred. On the other hand, the voltage of the gate of the second input transistor 203 may be kept at the reset voltage VRES. Thus, the voltage difference according to the amount of the charges may emerge between the two input nodes of the differential amplifier, and the differential amplifier may output the current signal according to the voltage difference.

At T5, the PTS turns into a high level. When the PTS is of a high level, the voltage signal converted from the current signal from the pixel may be stored in the CTS capacitor 116. At T5, the voltage of the input node (node 208) of the pixel amplification unit is a voltage corresponding to the amount of the charges generated by the incident light. Accordingly, a voltage signal corresponding to the amount of the incident light is stored in the CTS capacitor 116. The voltage signal corresponding to the amount of the incident light may contain a reset nose, which is generated when the reset transistor turns off. After a period passes since T5, the PTS turns into a low level.

The PRES turns into a high level at T6 and the PTX turns into a high level at T7, whereby the reset voltage VRES may be provided for the node 208 and the cathode of the PD 201. In other words, the pixel 101 may be reset. In another case, the PRES and the TTX turn into high levels simultaneously. In further another case, the PTX turns into a high level before the PRES turns into a high level. After a period passes since T7, the PTX turns into a low level. After the pixel has been reset, the PSEL turns into a low level. The PSEL may turn into a low level before the signal is output from the pixel to be read out thereafter.

From T8, the signal which is stored in the voltage signal storing portion of each pixel column is serially read out. At T8, the H1 turns into a high level, whereby the voltage signals stored in the CTN capacitor 115 and CTS capacitor 116 of the leftward pixel column in FIG. 1 are read out into the output portion. At T9, the H2 turns into a high level, whereby the voltage signals stored in the CTN capacitor 115 and CTS capacitor 116 of the middle pixel column in FIG. 1 are read out into the output portion. At T10, the H3 turns into a high level, whereby the voltage signals stored in the CTN capacitor 115 and CTS capacitor 116 of the rightward pixel column in FIG. 1 are read out into the output portion.

In one or more embodiments, reading out of signals from the pixels in a different row may start after the all of the voltage signals stored in the voltage signal storing portions are read out. In other embodiments, reading out of signals from the pixels in a different row may start after the voltage signals are stored in the voltage signal storing portions. At T7, for example, reading out for the pixel to be read out sequentially is started.

In other embodiments, the selection transistor may be omitted. In this case, the PSEL is not provided. Alternatively, a voltage for turning off one or both of the first and second input transistors 202, 203 may be provided for the gates thereof during a corresponding period, in which the PSEL is of a low level. Accordingly, the pixel may be set in a non-selected state.

In the pixel corresponding to FIG. 3, a timing of turning off the reset transistor 209 and a timing of turning off the connection transistor 210 may be offset. In detail, the reset transistor 209 turns off before the connection transistor 210 turns off. By this order of the operation, the reset noises, which are generated when the reset transistor 209 turns off, may be substantially equally divided into the two input nodes. As the result, since the divided noises may cancel each other by the differential amplification, noises in the current signal may be reduced.

The read out of the signal that the pixel outputs when in a state of being reset may be omitted. Even though the read out of the signal that the pixel outputs when in a state of being reset is omitted, an offset noise of the pixel and the reset noise may be reduced because the pixel amplification unit is the differential amplifier. However, with the read out of the current signal that the pixel outputs when in a state of being reset, offset noises generated in the subsequent states of the pixel may be reduced.

Hereinafter, another exemplary operation for the photoelectric conversion device according to one or more embodiments will be described. In this operation, the drive signal PSEL may be provided parallel for the pixels in a plurality of the pixel rows. Thus, the pixels in the plurality of the pixel rows may simultaneously output the current signals to the same first output line 104. According to this way of operation, the current signals may be summed up or averaged at the first output line 104. In this case, each of the drive signals PSEL, PRES, PTX may be provided for the pixels in the plurality of the pixel rows simultaneously.

FIG. 9 is a timing chart of the drive signals for the above described addition or average. The drive signals PSELn, PRESn and PTXn are respectively provided for the PSEL node, the PRES node and the PTX node of the pixel included in the pixel row N. The drive signals PSELn+1, PRESn+1 and PTXn+1 are respectively provided for the PSEL node, the PRES node and the PTX node of the pixel included in the pixel row N+1.

As illustrated in FIG. 9, the drive signals for the pixel row N and for the pixel row N+1 are synchronized. Thus, the current signals of the pixels included in a plurality of the pixel rows may be output to the first output line 104 in parallel. The detailed operation in the FIG. 9 is the same as in FIG. 8, and the detailed description is not repeated.

For addition of two current signals from two pixels, the bias current source 102 may output the bias current which has the amplitude twice as large as that of the bias current the bias current source 102 may output when the current signal from a single pixel is individually output. Then each of the differential amplifiers of the two pixels may be provided with the bias current as large as that provided when the current signal from a single pixel is individually output. Accordingly, the current signals to be added to each other, or summed up, may have respectively the same amplitude as output individually. In the case where the current signals from more than two pixels are summed up, the bias current may be turned up in accordance with the number of the signals to be summed up. For the average of the current signals, the bias current may be set in the same amplitude when the current signal from a single pixel is being output.

As described above, the pixel includes the differential amplifier. And, the transistors included in pixel have the same conductivity type. Thus, in one or more embodiments, sensitivity may be improved.

Second Exemplary Embodiment

Figure 10:
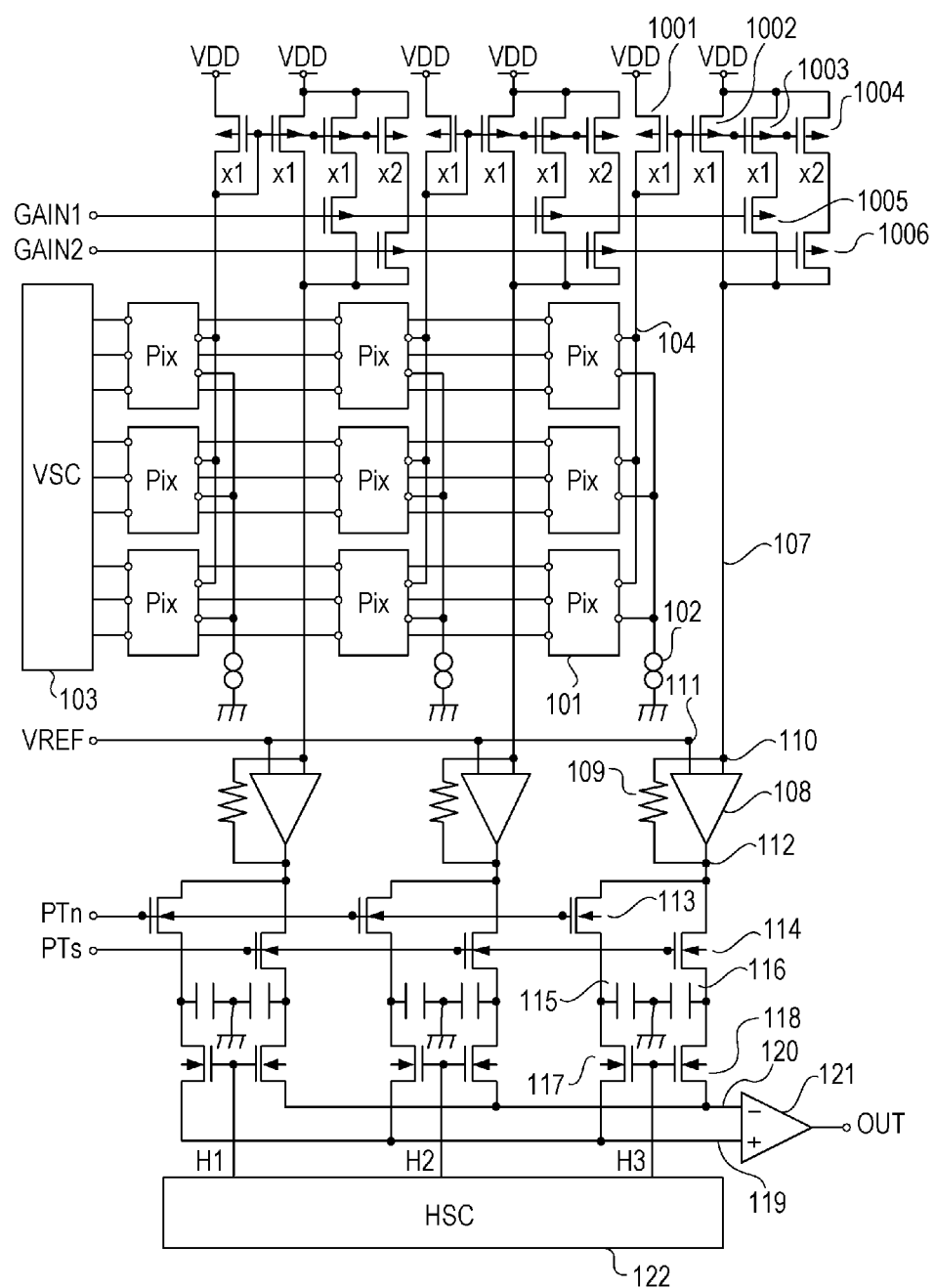
FIG. 10 illustrates an equivalent circuit of a second exemplary embodiment.

FIG. 10 illustrates an equivalent circuit of a photoelectric conversion device according to one or more embodiments. The same reference symbols are used to indicate elements in FIG. 10 and FIG. 1 which perform the same or a similar function, and detailed descriptions of the elements are not repeated.

The photoelectric conversion device of the present embodiment includes a plurality of pixels, a current mirror circuit, a current to voltage convertor, a voltage signal storing portion, an output portion, a vertical scanning circuit and a horizontal scanning circuit. In each of the pixels, incident light may be converted into a charge. The vertical scanning circuit provides the pixels with drive signals. In accordance with the drive signals, a current signal corresponding to the amount of charges generated by the photoelectric conversion unit is output from the pixel. The current signal from the pixel is input to the current to voltage convertor via the current mirror circuit. The current to voltage convertor converts the current signal, which is output from the pixel, into a voltage signal. The voltage signal storing portion stores the voltage signal, which is converted from the current signal. According to drive signals the horizontal scanning circuit provides, the voltage signal stored by the storing portion is read out to the output portion. The output portion output the voltage signal to the outside of the device.

In the present embodiment, the amplification factor of the current mirror circuit is controllable. The other features may be the same as the above described embodiment. The detailed explanation of the same features as the above described embodiment is not repeated.

The current mirror circuit includes an input-side transistor 1001 and three output-side transistors 1002, 1003 and 1004. The input and output-side transistors 1001, 1002, 1003, and 1004 are P-type channel MOS transistors.

The gate and the drain of the input-side transistor 1001 are shorted. The source of the input-side transistor 1001 is electrically connected to a power source line. The power source line may provide the source of the input-side transistor 1001 with a power source voltage VDD. The first output line 104 is electrically connected to the drain of the input-side transistor 1001 and the gate which is shorted to the drain of the input-side transistor 1001.

The output-side transistors 1002, 1003 and 1004 are arranged in parallel. In detail, the sources of the output-side transistors 1002, 1003 and 1004 are respectively connected to the power source line. The power source line may provide the sources of the output-side transistors 1002, 1003 and 1004 with the power source voltage VDD. The gates of the output-side transistors 1002, 1003 and 1004 are respectively connected to the gate of the input-side transistor 1001. The drains of the output-side transistors 1002, 1003 and 1004 are respectively connected to the second output line 107.

The input-side transistor 1001 and the first and second output-side transistors have the substantially same channel widths. The third output-side transistor 1004 has twice as a wide channel width as the input-side transistor 1001. The input and output-side transistors 1001, 1002, 1003 and 1004 have the substantially same channel length.

A first gain control switch 1005 is arranged in an electrical path between the drain of the second output-side transistor 1003 and the second output line 107. The first gain control switch 1005 is a P-type channel MOS transistor. A drive signal GAIN1 may control the first gain control switch 1005 to be turned on or off.

A second gain control switch 1006 is arranged in an electrical path between the drain of the third output-side transistor 1004 and the second output line 107. The second gain control switch 1006 is a P-type channel MOS transistor. A drive signal GAIN2 may control the second gain control switch 1006 to be turned on or off.

The first and second gain control switches 1005 and 1006 may control the amplification factor of the current mirror circuit. The first and second gain control switches 1005 and 1006 may be included in an amplification factor control portion. By using the two gain control switches 1005 and 1006, four gain settings may be set.

When both of the first and second gain control switches 1005 and 1006 are turned off, the second and third output-side transistors 1003 and 1004 are disconnected from the second output line 107. Accordingly, only the first output-side transistor 1002 of the three may be connected to the second output line 107. In this case, the mirrored current signal may be output at the amplification factor of about 1.

When the first gain control switch 1005 is turned on and the second gain control switch 1006 is turned off, the third output-side transistors 1004 is disconnected from the second output line 107. Accordingly, the first and second output-side transistors 1002 and 1003 of the three may be connected to the second output line 107. Since the output-side transistors are arranged in parallel, a virtual output-side transistor which has twice as a wide channel width as the input-side transistor 1001 may be considered. In this case, the mirrored current signal may be output at the amplification factor of about 2.

When the first gain control switch 1005 is turned off and the second gain control switch 1006 is turned on, the second output-side transistors 1003 is disconnected from the second output line 107. Accordingly, the first and third output-side transistors 1002 and 1004 of the three may be connected to the second output line 107. Since the output-side transistors are arranged in parallel, a virtual output-side transistor which has three times as a wide channel width as the input-side transistor 1001 may be considered. In this case, the mirrored current signal may be output at the amplification factor of about 3.

When both of the first and second gain control switches 1005 and 1006 are turned on, all of the three output-side transistors 1002, 1003 and 1004 may be connected to the second output line 107. Since the output-side transistors are arranged in parallel, a virtual output-side transistor which has four times as a wide channel width as the input-side transistor 1001 may be considered. In this case, the mirrored current signal may be output at the amplification factor of about 4.

As mentioned above, the amplification factor of the current mirror circuit is controllable.

In FIG. 10, three output-side transistors are arranged. However, the number of the output-side transistors is not limited to three. According to the size of each of the transistors, the amplification factor may be determined.

In the case where the current signals from the pixels are individually output, the amplification factor may be changed. For example, the amplification factor may be controlled to be large when the current signal from the pixel has small amplitude, while to be small when the current signal from the pixel has large amplitude.

The amplification factor may be changed between the case where the current signal from a single pixel is output and the case where the current signals form a plurality of the pixels are simultaneously output. For adding or averaging the current signals, a small amplification factor may be used. The small amplification factor may result in a large dynamic range of the subsequent stages.

An exemplary structure of the pixel may be the same as the above described embodiment. The equivalent circuit of the pixel is illustrated in FIG. 2, 3 or 4. The exemplary planar and cross-sectional structures of the pixel are illustrated in FIGS. 5, 6 and 7.

An exemplary operation for the photoelectric conversion device according to the present embodiment may be the same as the above described embodiment. The photoelectric conversion device may be operated according to the drive signals illustrated in FIG. 8 or in FIG. 9.

In the present embodiment, since the amplification factor of the current mirror circuit is controllable, a wide dynamic range and a high signal-to-noise ratio (SN ratio) may be obtained. For capturing a dark object, improvement in SN ratio may be obtained because of a high gain of the current mirror circuit. For capturing a bright object, which is less effected by noises, improvement in dynamic range may be obtained because of a low gain of the current mirror circuit.

Third Exemplary Embodiment

Figure 11:
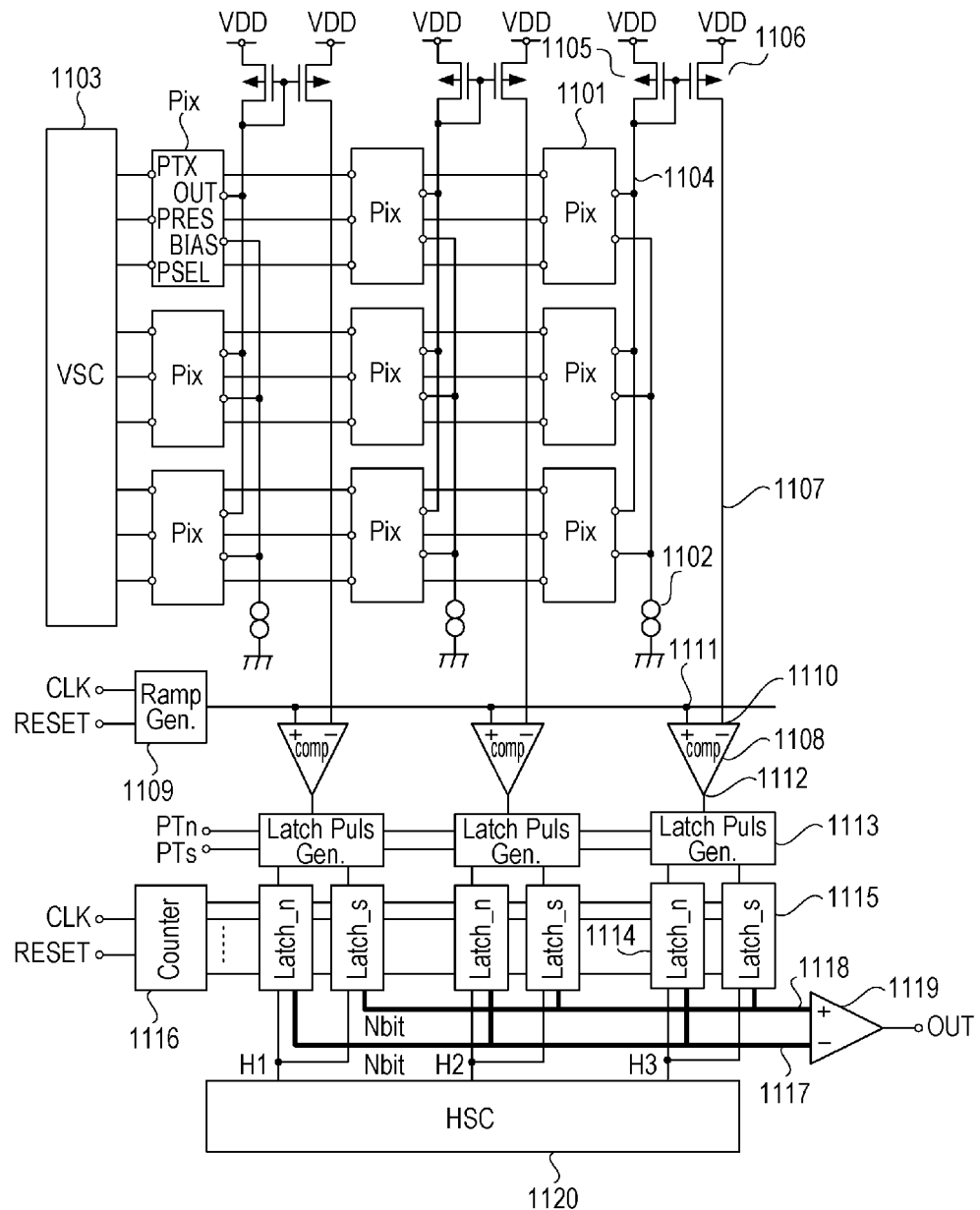
FIG. 11 illustrates an equivalent circuit of a third exemplary embodiment.

FIG. 11 illustrates an equivalent circuit of a photoelectric conversion device according to one or more embodiments. The photoelectric conversion device includes a plurality of pixels, a current mirror circuit, an analog to digital convertor (A-D convertor), an output portion, a vertical scanning circuit and a horizontal scanning circuit. In each of the pixels, incident light may be converted into a charge. The vertical scanning circuit provides the pixels with drive signals. In accordance with the drive signals, a current signal corresponding to the amount of charges generated by the photoelectric conversion unit is output from the pixel. The current signal from the pixel is input to the A-D convertor via the current mirror circuit. The A-D convertor converts the current signal, which is output from the pixel as an analog signal, into a digital signal. According to drive signals the horizontal scanning circuit provides, the digital signal is read out to the output portion. The output portion outputs the digital signal to the outside of the device.

The A-D convertor includes a comparator, a latch pulse generator, a memory and a counter. The current signals from the pixels are converted into the digital signals at respective pixel columns. The comparator compares the current signal from the pixel with a ramp current signal. The comparator outputs a pulse based on a timing of an inversion of the amplitude relationship between the current signal from the pixel and the ramp current signal. According to the pulse the comparator outputs, the latch pulse generator input a latch pulse to a latch circuit of the memory. The memory stores a count value that the counter is outputting when the latch pulse is input to the memory. The count value stored in memory is the digital signal converted from the current signal.

In the present embodiment, at each pixel column, the current signal is converted into the digital signal. Further, in the present embodiment, the current signal from the pixel is mirrored by the current mirror circuit, and a mirrored current signal is input to the comparator for comparing with the ramp current signal.

Each part of the photoelectric conversion device of the present embodiment will be described in detail. The plurality of pixels 1101 are arranged so as to form a pixel array including three rows and three columns. The number of the pixels 1101 is not limited. For example, the plurality of pixels 1101 are arranged so as to form a pixel array including more than 1000 rows and more than 1500 columns. In another case, the plurality of pixels 1101 may be arranged in a line so as to form a line sensor.

Signals from the pixels 1101 included in a single pixel column may be processed in common circuitry. In the following description, exemplary one of the pixel columns will be explained. The other pixel columns may have the same structure, configuration and/or circuitry as the exemplary one.

The pixel 1101 includes at least a photoelectric conversion unit and a pixel amplification unit. Incident light may be converted into a charge by the photoelectric conversion unit. The pixel amplification unit may output a current signal corresponding to the amount of charges generated by the photoelectric conversion unit. Thus, the pixel 1101 may be a signal source configured to output a current signal. The pixel 1101 includes OUT node, via which the current signal from the pixel 1101 is output. The pixel 1101 may further include a BIAS node, via which a bias current is provided from a bias current source, and a plurality of nodes (PTX node, PRES node and PSEL node), via which drive signals are provided. The detailed structure of the pixel 1101 will be described later.

The BIAS node of the pixel 1101 is electrically connected to the bias current source 1102. A plurality of the pixel 1101 may be electrically connected to the common bias current source 1102. For example, the pixels 1101 included in a single pixel column are electrically connected to the common bias current source 1102. In another case, a bias current source 1102 may be provided for each of the pixels 1101 in the pixel column.

The PTX node, the PRES node and the PSEL node are electrically connected to the vertical scanning circuit 1103. The vertical scanning circuit 1103 may provide a common drive signal for the pixels 1101 included in a single pixel row. Further, the vertical scanning circuit 1103 may provide the pixels included in different rows from each other with independent drive signals. According to the drive signals the vertical scanning circuit provides, the signals are read out from the pixels 1101 on the pixel row basis.

The OUT node of the pixel 1101 is electrically connected to a first output line 1104. The OUT nodes of a plurality of the pixels 1101 may be electrically connected to the common first output line 1104. For example, the OUT nodes of the pixels 1101 included in a single pixel column are electrically connected to the common first output line 1104. Thus, the current signals from the plurality of the pixels 1101 may be output to the first output line 1104.

The first output line 1104 is electrically connected to the current mirror circuit. An output node of the current mirror circuit is electrically connected to a second output line 1107. The current mirror circuit includes an input-side transistor 1105 and an output-side transistor 1106. The input-side and output-side transistors 1105, 1106 are P-type channel MOS (Metal Oxide Semiconductor) transistors. The gate and the drain of the input-side transistor 1105 are shorted. The source of the input-side transistor 1105 is electrically connected to a power source line. The power source line may provide the source of the input-side transistor 1105 with a power source voltage VDD. The gate of the output-side transistor 1106 is electrically connected to the gate of the input-side transistor 1105. The source of the output-side transistor 1106 is electrically connected to a power source line. The power source line may provide the source of the output-side transistor 1106 with a power source voltage VDD. The first output line 1104 is electrically connected to the drain of the input-side transistor 1105 and the gates which are shorted to the drain of the input-side transistor 1105. The drain of the output-side transistor 1106 is electrically connected to the second output line 1107.

In the current mirror circuit, a current running through the input-side transistor 1105 may be mirrored in the output-side transistor 1106. In other words, the current mirror circuit may output a current signal (a mirrored current signal) corresponding to the current signal at the first output line 1104 into the second output line 1107. The current mirror circuit may output the mirror current signal which is amplified or attenuated with respected to the current signal at the first output line 1104. The amplification (or attenuation) factor may be determined according to a ratio of the sizes of the input and output-side transistors 1105, 1106. For example, in case that the input and output-side transistors 1105, 1106 have the substantially same channel length, the amplification (or attenuation) factor may be the ratio of the channel widths.

The current signal at the second output line 1107 is input to the A-D convertor, and converted into a digital signal. The A-D convertor includes a comparator 1108. The comparator 1108 has a signal input node 1110, a reference current input node 1111 and output node 1112. The second output line 1107 is electrically connected to the signal input node 1110. The reference current input node 1111 of the comparator 1108 is electrically connected to a ramp current signal source 1109.

The comparator 1108 may compare the current signal input to the signal input node 1110 with a ramp current signal, which is the reference current signal, and output a voltage signal corresponding to the amplitude relationship of the current signals. In detail, the comparator 1108 may output a first voltage when the current signal from the pixel 1101 is larger than the ramp current signal. The comparator 1108 may output a second voltage, which is different from the first voltage, when the ramp current signal is larger than the current signal from the pixel 1101. For example, the first voltage may be near the ground voltage GND, and the second voltage near the power source VDD, or vice versa. The detailed structure of the comparator 1108 will be described later.

The ramp current signal source 1109 outputs the ramp current signal, whose amplitude may be continuously variable. In another case, the ramp current signal source 1109 outputs the ramp current signal, whose amplitude may vary step-by-step according to a clock signal CLK. The ramp current signal source 1109 is provided with a ramp reset signal via a reset node. According to the ramp reset signal, the ramp current signal is reset to an initial value. The detailed structure of the ramp current signal source 1108 will be described later.

The A-D convertor of the present embodiment includes a latch pulse generator 1113, memory (N latch circuit 1114 and S latch circuit 1115) and a counter 1116. The output node 1112 of the comparator 1108 is electrically connected to the latch pulse generator 1113. The latch pulse generator 1113 may be provided with drive signals PTN and PTS. According to the drive signals PTN and PTS, a node to which the latch pulse is output may be selected. The latch pulse generator 1113 outputs a latch pulse selectively into N latch circuit 1114 or into S latch circuit 1115 based on a timing of an inversion of the voltage signal the comparator 1108 outputs.

The N latch circuit 1114 and the S latch circuit 1115 are provided with count value from the counter 1116. When the latch pulse is input, the N latch circuit 1114 and the S latch circuit 1115 may store the count value the counter 1116 is outputting at the time.

The counter 1116 counts up or down and outputs the count value according to the clock signal CLK. When a counter reset signal is provided via a reset node of the counter 1116, the count value is reset to an initial value. The count value corresponding to the amplitude of the current signal may be stored in the latch circuit by synchronized drive signals provided for the ramp current signal source 1109 and the counter 1116. Thus, the current signal is converted into a digital signal.

The memory (the N latch circuit 1114 and the S latch circuit 1115) is electrically connected to an output portion. In detail, the N latch circuit 1114 is connected to an output circuit 1119 via a third output line 1117, and the S latch circuit 1115 is connected to the output circuit 1119 via the fourth output line 1118.

The horizontal scanning circuit 1120 provides each of the latch circuits 1114, 1115 with a drive signal. According to the drive signal from the horizontal scanning circuit 1120, each of the latch circuits 1114, 1115 outputs the stored count value as the digital signal into the output circuit 1119.

The output circuit 1119 may include LVDS (Low Voltage Differential Signaling) circuit. Additionally, the output circuit 1119 may digitally process the digital signals from the latch circuits 1114, 1115. For example, the output circuit may output differential between the digital signal of the S latch circuit 1114 and the digital signal of the N latch circuit 1115.

As described above, a signal from the pixel, which is a signal source, is converted into a digital signal and is output to the outside of the photoelectric conversion device.

Hereinafter, an exemplary structure of the pixel 1101 will be described in detail. The pixel 1101 includes at least the photoelectric conversion unit and the pixel amplification unit. Incident light may be converted into a charge by the photoelectric conversion unit. The pixel amplification unit may output a current signal corresponding to the amount of charges generated by the photoelectric conversion unit.

Figure 12:
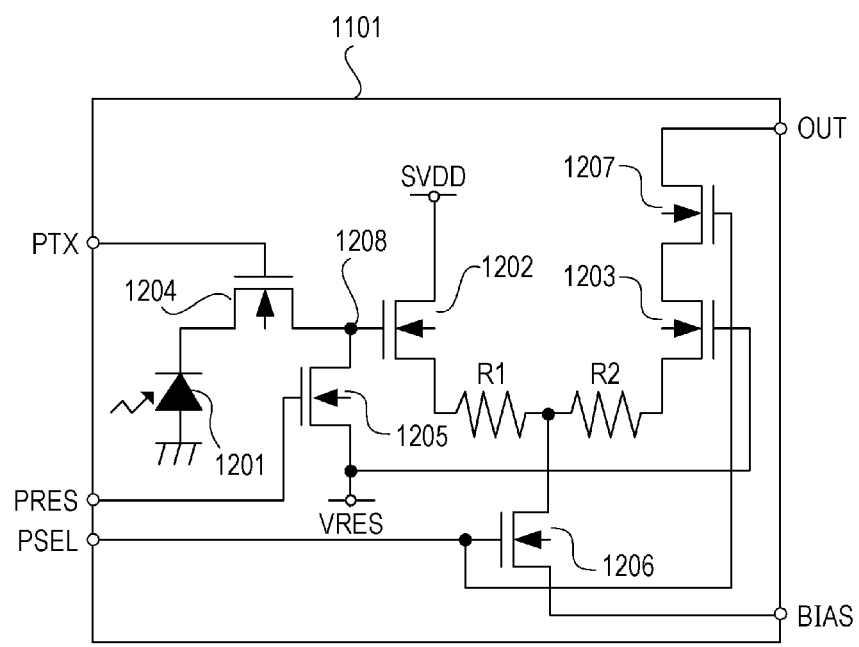
FIG. 12 illustrates an equivalent circuit of an exemplary pixel of an exemplary embodiment.

FIG. 12 illustrates an equivalent circuit of the pixel 1101 according to one or more embodiments. The photoelectric conversion unit may be, for example, a photodiode (below, PD) 1201. The pixel amplification unit may be, for example, a differential amplifier. The differential amplifier includes a first input transistor 1202 and a second input transistor 1203. The pixel 1101 may include a transfer transistor 1204, a reset transistor 1205, a first selection transistor 1206, a second selection transistor 1207, a resistor R1 and a resistor R2.

The anode of the PD 1201 is provided with a ground voltage GND. The cathode of the PD 1201 is electrically connected to a node 1208 via the transfer transistor 1204. The transfer transistor 1204 transfers the charges generated at the PD 1201 to the node 1208.

The gate of the first input transistor 1202 is electrically connected to the node 1208. The gate of the first input transistor 1202 is a first input node of the differential amplifier. The voltage at the gate of the first input transistor 1202 may be a voltage corresponding to the amount of charges which are transferred to the node 1208. In another aspect, the transferred charges are converted into a voltage signal at the node 1208. The drain of the first input transistor 1202 is electrically connected to the power source line. The power source line may provide the drain of the first input transistor 1202 with a power source voltage SVDD. The power source voltage SVDD may be the same as the power source voltage VDD which provided for the current mirror circuit. In another case, the power source voltage SVDD and the power source voltage VDD may be different from each other. The source of the first input transistor 1202 is electrically connected to the drain of the first selection transistor 1206 via the resistor R1.

The gate of the second input transistor 1203 is electrically connected to a reset voltage line. The gate of the second input transistor 1203 is a second input node of the differential amplifier. The reset voltage line may provide the gate of the second input transistor 1203 with a reset voltage VRES. The source of the second input transistor 1203 is electrically connected to the drain of the first selection transistor 1206 via the resistor R2. The drain of the second input transistor 1203 is electrically connected to the source of the second selection transistor 1207.

The node 1208 is electrically connected to the reset voltage line via the reset transistor 1205. When the reset transistor 1205 is turned on, the node 1208 is provided with the reset voltage VRES. In other words, the reset transistor 1205 may reset the voltage of the first input node of the differential amplifier.

The drain of the first selection transistor 1206 is electrically connected to the resistor R1 and the resistor R2. The source of the first selection transistor 1206 is electrically connected to the BIAS node. The drain of the second selection transistor 1207 is electrically connected to the OUT node. The BIAS node is electrically connected to the bias current source 1102 and the OUT node is electrically connected to the first output line 1104.

The gate of the transfer transistor 1204 is electrically connected to the PTX node. The gate of the reset transistor 1205 is electrically connected to the PRES node. The gates of the first and second selection transistors 1206, 1207 are electrically connected to the PSEL node. The vertical scanning circuit 1103 provides each gate of the transistors with a drive signal for controlling each of the transistors to be turned on or off.

The first input transistor 1202 and the second input transistor 1203 may form a differential pair. That is, the sources of the two transistors 1202, 1203 are electrically connected to the common bias current source 1102. A drain current of the second input transistor 1203, which is the current signal to be output from the pixel 1101, corresponds to the difference of the voltages at the gates of the two transistors 1202, 1203. Thus, the differential pair of the first input transistor 1202 and the second input transistor 1203 is included in the differential amplifier.

The first and second selection transistors 1206, 1207 may select a pixel 1101 which outputs the current signal, out of the plurality of the pixels 1101. In detail, when both of the first and second selection transistors 1206, 1207 are on, the differential amplifier may output the current signal via the OUT node.

In FIG. 12, the first and second selection transistors 1206, 1207 are provided for selection of the pixel. Providing the first selection transistor 1206 may reduce power consumption by cutting the current when the pixel is in a non-selective state. Providing the second selection transistor 1207 may reduce the parasitic capacitance of the first output line 1104.

One of the first and second selection transistors 1206, 1207 may be omitted. In case the second selection transistor 1207 is omitted, accuracy of the current signal may be improved because the symmetrical characteristic of the differential amplifier may be improved.

Further, a third selection transistor may be provided in an electrical path between the drain of the first input transistor 1202 and the power source line. In case both of the second and third selection transistors are provided, accuracy of the current signal may be improved because the symmetrical characteristic of the differential amplifier may be improved.

In another case, both of the first and second selection transistors 1206, 1207 may be omitted. In this case, the pixel 1101 may be set in non-selective state by providing the gate of the first and second input transistors 1202, 1203 with a voltage such that the both transistors 1202, 1203 are turned into off. For example, such voltage may be provided from the reset voltage line. In case both of the first and second selection transistors 1206, 1207 are omitted, the fill factor of the pixel may be improved by reduction of the number of the pixel transistors.

The transfer transistor 1204 may be provided in one or more embodiments. In other embodiments, the transfer transistor 1204 may be omitted. In case the transfer transistor 1204 is omitted, the fill factor of the pixel may be improved by reduction of the number of the pixel transistors.

Hereinafter, another exemplary structure of the pixel 1101 will be described in detail. The pixel 1101 includes at least the photoelectric conversion unit and the pixel amplification unit. Incident light may be converted into a charge by the photoelectric conversion unit. The pixel amplification unit may output a current signal corresponding to the amount of charges generated by the photoelectric conversion unit.

Figure 13:
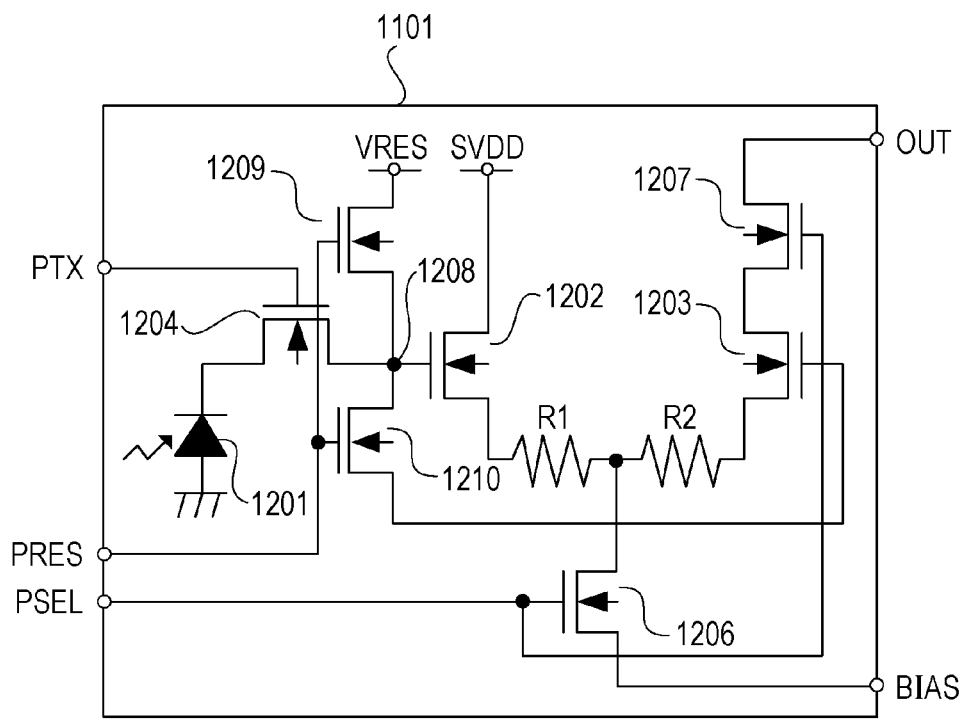
FIG. 13 illustrates an equivalent circuit of an exemplary pixel of an exemplary embodiment.

FIG. 13 illustrates an equivalent circuit of the pixel 1101 according to one or more embodiments. The photoelectric conversion unit may be, for example, a photodiode (below, PD) 1201. The pixel amplification unit may be, for example, a differential amplifier. The differential amplifier includes a first input transistor 1202 and a second input transistor 1203. The pixel 1101 may include a transfer transistor 1204, a reset transistor 1209, a connection transistor 1210, a first selection transistor 1206, a second selection transistor 1207, a resistor R1 and a resistor R2.

The anode of the PD 1201 is provided with a ground voltage GND. The cathode of the PD 1201 is electrically connected to a node 1208 via the transfer transistor 1204. The transfer transistor 1204 transfer the charges generated at the PD 1201 to the node 1208.

The gate of the first input transistor 1202 is electrically connected to the nod 1208. The gate of the first input transistor 1202 is a first input node of the differential amplifier. The voltage at the gate of the first input transistor 1202 may be a voltage corresponding to the amount of charges which are transferred to the node 1208. In another aspect, the transferred charges are converted into a voltage signal at the node 1208. The drain of the first input transistor 1202 is electrically connected to the power source line. The power source line may provide the drain of the first input transistor 1202 with a power source voltage SVDD. The power source voltage SVDD may be the same as the power source voltage VDD which provided for the current mirror circuit. In another case, the power source voltage SVDD and the power source voltage VDD may be different from each other. The source of the first input transistor 1202 is electrically connected to the drain of the first selection transistor 1206 via the resistor R1.

The gate of the second input transistor 1203 is electrically connected to a source of the connection transistor 1210. The gate of the second input transistor 1203 is a second input node of the differential amplifier. The source of the second input transistor 1203 is electrically connected to the drain of the first selection transistor 1206 via the resistor R2. The drain of the second input transistor 1203 is electrically connected to the source of the second selection transistor 1207.

The node 1208 is electrically connected to the reset voltage line via the reset transistor 1209. When the reset transistor 1209 is turned on, the node 1208 is provided with the reset voltage VRES. In other words, the reset transistor 1209 may reset the voltage of the first input node of the differential amplifier.

The connection transistor 1210 is provided in an electrical path between the gate of the first input transistor 1202 (the node 1208) and the gate of the second input transistor 1203. In other words, one of the source and the drain of the connection transistor 1210 is electrically connected to the gate of the first input transistor 1202 and the other to the gate of the second input transistor 1203. When the connection transistor is turned on, the gate of the first input transistor 1202 and the gate of the second input transistor 1203 are shorted to each other. When both of the reset transistor 209 and the connection transistor 1210 are turned on, the reset voltage VRES may be provided for the gate of the second input transistor 1203 via the reset transistor 209 and the connection transistor 1210.

The drain of the first selection transistor 1206 is electrically connected to the resistor R1 and the resistor R2. The source of the first selection transistor 1206 is electrically connected to the BIAS node. The drain of the second selection transistor 1207 is electrically connected to the OUT node. The BIAS node is electrically connected to the bias current source 1102 and the OUT node is electrically connected to the first output line 1104.

The gate of the transfer transistor 1204 is electrically connected to the PTX node. The gate of the reset transistor 1209 and the gate of the connection transistor 1210 are electrically connected to the PRES node. The gates of the first and second selection transistors 1206, 1207 are electrically connected to the PSEL node. The vertical scanning circuit 1103 provides each gate of the transistors with a drive signal for controlling each of the transistors into on or off.

In FIG. 13, the gate of the reset transistor 1209 and the gate of the connection transistor 1210 are electrically connected to each other. In another case, the gate of the reset transistor 1209 and the gate of the connection transistor 1210 may be provided with independent drive signals. In this case the reset transistor 1209 and the connection transistor 1210 may be controlled independently from each other. For example, when the both of the reset transistor 1209 and the connection transistor 1210 are on, the reset transistor 1209 is firstly turned off, thereafter the connection transistor 1210 is turned off.

The first input transistor 1202 and the second input transistor 1203 may form a differential pair. That is, the sources of the two transistors 1202, 1203 are electrically connected to the common bias current source 1102. A drain current of the second input transistor 1203, which is the current signal to be output from the pixel 1101, corresponds to the difference of the voltages at the gates of the two transistors 1202, 1203. Thus, the differential pair of the first input transistor 1202 and the second input transistor 1203 is included in the differential amplifier.

The first and second selection transistors 1206, 1207 may select a pixel 1101 which outputs the current signal, out of the plurality of the pixels 1101. In detail, when both of the first and second selection transistors 1206, 1207 are on, the differential amplifier may output the current signal via the OUT node.

In FIG. 13, a second reset transistor may be provided in an electrical path between the gate of the second input transistor 1203 and the reset voltage line. In this case, accuracy of the current signal may be improved because the symmetrical characteristic of the differential amplifier may be improved.

Figure 14:
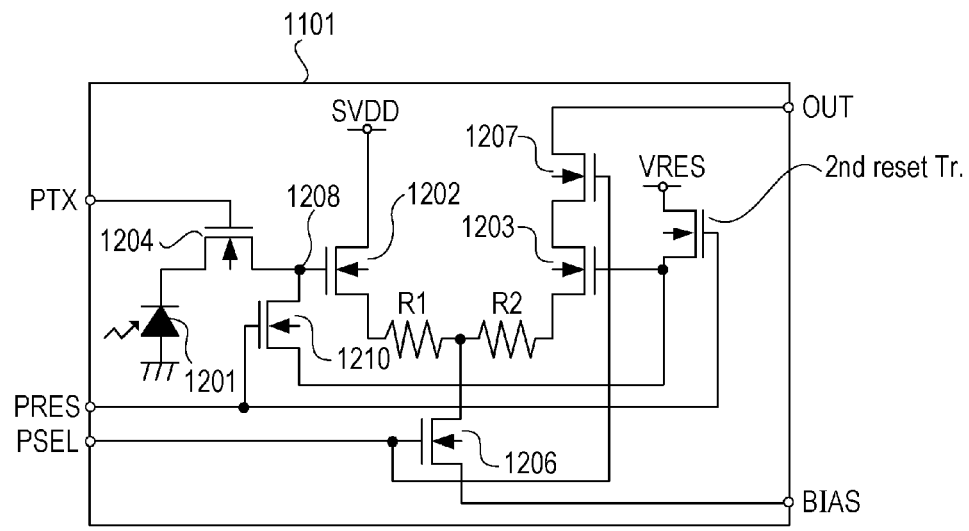
FIG. 14 illustrates an equivalent circuit of an exemplary pixel of an exemplary embodiment.

Other exemplary structure of the pixel 1101 will be described in detail. FIG. 14 illustrates an equivalent circuit of the pixel 1101 according to one or more embodiments. The reset transistor 1209 in FIG. 13 is omitted in FIG. 14. Two transistors (the transfer transistor 1204 and the connection transistor 1210) are connected to the gate of the first input transistor 1202. Two transistors (the second reset transistor and the connection transistor 1210) are connected to the gate of the second input transistor 1203. Accordingly, since the same number of the transistors is connected to each of the first and second input node of the differential amplifier, accuracy of the current signal may be improved.

In FIGS. 13 and 14, the first and second selection transistors 1206, 1207 are provided for selection of the pixel. Providing the first selection transistor 1206 may reduce power consumption by cutting the current when the pixel is in a non-selective state. Providing the second selection transistor 1207 may reduce the parasitic capacitance of the first output line 1104.

One of the first and second selection transistors 1206, 1207 may be omitted. In case the second selection transistor 1207 is omitted, accuracy of the current signal may be improved because the symmetrical characteristic of the two input nodes of the differential amplifier may be improved.

Further, a third selection transistor may be provided in an electrical path between the drain of the first input transistor 1202 and the power source line. In case both of the second and third selection transistors are provided, accuracy of the current signal may be improved because the symmetrical characteristic of the differential amplifier may be improved.

In another case, both of the first and second selection transistors 1206, 1207 may be omitted. In this case, the pixel 1101 may be set in non-selective state by providing the gate of the first and second input transistors 1202, 1203 with a voltage such that the both transistors 1202, 1203 are turned off. For example, such voltage may be provided from the reset voltage line. In case both of the first and second selection transistors 1206, 1207 are omitted, the fill factor of the pixel may be improved by reduction of the number of the pixel transistors.

Further, the pixel configuration in FIG. 13 may change such that a charge of the PD 1201 may be transferred to the gate of the second input transistor 1203. In other words, the transfer transistor may be provided not in an electrical path between the PD 1201 and the gate of the first input transistor 1202, but in an electrical path between the PD 1201 and the gate of the second input transistor 1203. In this case, since the same number of the transistors is connected to each of the first and second input node of the differential amplifier, accuracy of the current signal may be improved. Each gate of the first and second input transistors 1202, 1203 may be set in an electrically floating state after the reset voltage VRES is provided. Accordingly, the current signal corresponding to the difference of the voltages between the two input nodes may be output regardless of which one of the two input node the charge of the PD 1201 is transferred to.

In FIGS. 13 and 14, provided is the connection transistor 1210 which connected to the two input nodes of the differential amplifier. Accordingly, the reset noise, which is generated when the input nodes are reset, may be substantially equally divided into the two input nodes. Since the divided noises may cancel each other by the differential amplification, noises in the current signal may be reduced.

As shown in FIG. 11, in one or more embodiments, the circuit for reading out the current signal corresponding to the amount of charges generated in the photoelectric conversion unit into the first output line 1104, which is illustrated in each of FIGS. 12, 13 and 14, is repeatedly or periodically arranged. That is, the circuit illustrated in any one of FIGS. 12, 13 and 14 is provided each of the plurality of the photoelectric conversion units. In other words, transistors included in the readout portion are repeatedly, or periodically, arranged so as to corresponding to a plurality of the pixels whose signals are output to the common output line (the first output line 1104).

In other embodiments, the circuit illustrated in any one of FIGS. 12, 13 and 14 may be repeatedly, or periodically, provided every two or more of the plurality of the photoelectric conversion units. In detail, charges of two photoelectric conversion units may be transferred into the gate of the first input transistor 1202, which is commonly provided for the two photoelectric conversion units. In this case, a plurality of the photoelectric conversion units may share the transistors other than the transfer transistor. Therefore the fill factor of the pixel may be improved by reduction of the number of the pixel transistors.

In the present embodiment, the transistors each of which is repeatedly, or periodically, provided so as to correspond to the plurality of the photoelectric conversion units may have the same conductivity type. Specifically, the first and second input transistors 1202, 1203, the transfer transistor 1204, the reset transistor 1205, the first and second selection transistors 1206, 1207, the reset transistor 1209 and the connection transistor 1210 are respectively N-type channel MOS transistors. In this case, since a single conductivity type of a well may be provided in the pixel 1101, the fill factor of the pixel, which is a ratio of a region that the photoelectric conversion unit occupies to a region of a single pixel, may be improved. Therefore, sensitivity and/or a saturation amount of charges may be improved.

In the present embodiment, the electron may be used as the signal charge, and the N-type channel transistors may be provided in the pixel. In this case, since the photoelectric conversion unit and the transistors may be provided in the same well, the fill factor of the pixel may be improved. Therefore, sensitivity and/or a saturation amount of charges may be improved. When a hole is used as the signal charge, P-type channel transistors may be used.

An element which is not repeatedly arranged but is provided commonly for a plurality of the photoelectric conversion units may be included in the circuit for reading out the current signal corresponding to the amount of charges generated in the photoelectric conversion unit into the first output line 1104. For example, the bias current source 1102 in FIG. 11 may be included in the circuit for reading out, or the readout portion, because it may drive the differential amplifier by providing the bias current. In FIG. 11, the bias current source 1102, however, is provided for each of the plurality of the pixel rows. Thus, the bias current source 1102 is not an element which is repeatedly, or periodically, arranged so as to correspond to the plurality of the photoelectric conversion units whose signals are to be output to the common output line (the first output line 1104). Thus, the bias current source 1102 may include a P-type channel transistor.

Figure 18:
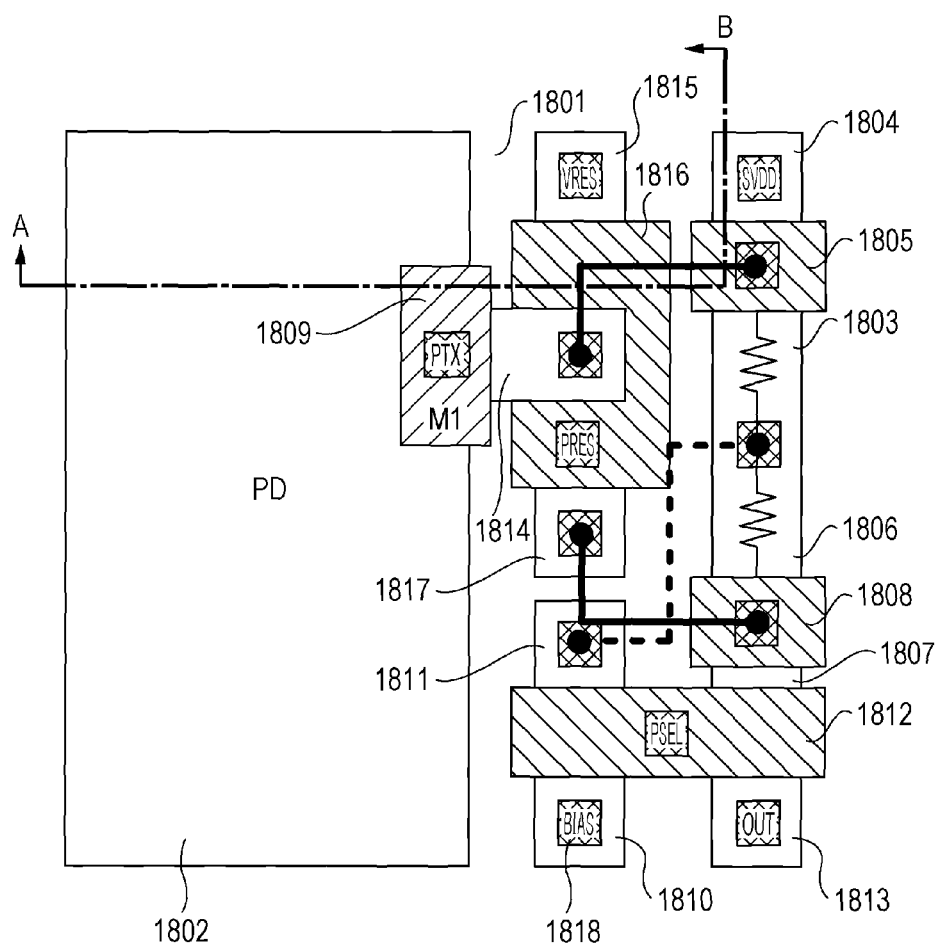
FIG. 18 is a schematic illustration of the planar structure of an exemplary pixel of an exemplary embodiment.

FIG. 18 is a schematic illustration of the planar structure of the pixel illustrated in FIG. 13. The pixel circuit may be provided in a semiconductor substrate, such as a silicon substrate or the like. The semiconductor substrate includes an active region, which is defined by an element isolation portion 1801. Elements, such as photodiodes, transistors and resistors, may be provided in the active region.

The element isolation portion 1801 may include an isolation structure such as LOCOS (Local Oxidation of Silicon) or STI (Shallow Trench Isolation). In another case, the element isolation portion 1801 may include an isolation structure using a PN junction. The element isolation portion 1801 may electrically isolate the PD and the transistors.

In the present embodiment, the MOS transistors are used in the pixel. Each transistor has a source region, a drain region, a gate electrode and a channel region. The source region, the drain region and the channel region are semiconductor regions provided in the semiconductor substrate. The gate electrode may be formed of a poly-silicon provided on the semiconductor substrate via an insulator film.

The PD 1201 includes a semiconductor region 1802. The first input transistor 1202 may include semiconductor regions 1803, 1804 and a gate electrode 1805 as the source, the drain and the gate. The second input transistor 1203 may include semiconductor regions 1806, 1807 and a gate electrode 1808 as the source, the drain and the gate. The semiconductor regions 1803 and 1806 may respectively form the resistors R1 and R2. The transfer transistor 1204 may include a gate electrode 1809 as the gate. The first selection transistor 1206 may include semiconductor regions 1810, 1811 and a gate electrode 1812 as the source, the drain and the gate. The second selection transistor 1207 may include semiconductor regions 1807, 1813 and the gate electrode 1812 as the source, the drain and the gate. The reset transistor 1209 may include semiconductor regions 1814, 1815 and a gate electrode 1816 as the source, the drain and the gate. The connection transistor 1210 may include the semiconductor regions 1814, 1817 and the gate electrode 1816 as the source, the drain and the gate, respectively.

Contact plugs 1818 are provided for the gate electrode and the semiconductor regions each of which forms the source or the drain. The semiconductor regions and the gate electrode may be connected to conductive members included in interconnections via the contact plugs 1818. For example, the semiconductor region 1814 and the gate electrode 1805 are connected to each other by the interconnection, and form the node 1208 in FIG. 13.

As shown in FIG. 18, two nodes, which are supposed to be electrically connected to each other, may be formed of a common semiconductor region or a common gate electrode. For example, since the drain of the second input transistor 1203 may be connected to the source of the second selection transistor 1207, both nodes are formed of the semiconductor region 1807. In another case, however, the two nodes may be formed of two separated semiconductor regions. The gate of the reset transistor 1209 and the gate of the connection transistor 1210 may be formed of two separated gate electrodes. Although, in FIG. 18, the resistors R1 and R2 are formed of the semiconductor regions 1803 and 1806, the resistors R1 and R2 may be thin film resistors formed of poly-silicon as the like.

As shown in FIG. 18, the structure from the gate electrode 1805 to the gate electrode 1808 may have symmetry with respect to a line. In this case, accuracy of the current signal may be improved because the symmetrical characteristic of the differential amplifier may be improved.

Figure 19:
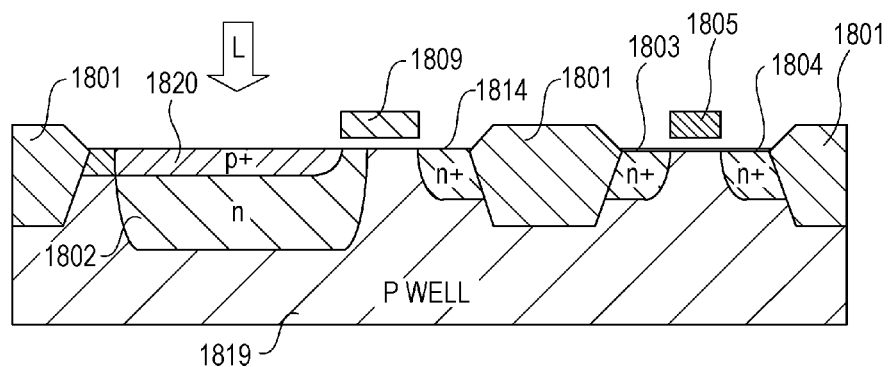
FIG. 19 is a schematic illustration of the cross-sectional structure of an exemplary pixel of an exemplary embodiment.

FIG. 19 is a schematic illustration of an exemplary cross-sectional structure taken along a line A-B in FIG. 18. The PD 1201, the transfer transistor 1204 and the first input transistor 1202 are exemplarily illustrated in FIG. 19. The same reference symbol is used to indicate elements in FIG. 19 and FIG. 18 which perform the same or a similar function, and detailed descriptions of the elements are not repeated.

The PD 1201 includes an N-type semiconductor region 1802. The N-type semiconductor region 1802 may accumulate generated charges therein. The first input transistor 1202 may include N-type semiconductor regions 1803 and 1804 as the source and the drain. Accordingly, the first input transistor 1202 may have an N-type channel. These N-type semiconductor regions may be provided in a P-type well 1819. The P-type well 1819 may be provided with the ground voltage GND.

The P-type well 1819 may be a semiconductor region formed by diffusing or implanting impurities into the semiconductor substrate. In another case, the P-type well 1819 may be formed by an epitaxial layer grown on the semiconductor substrate.

A P-type semiconductor region 1820 is provided adjacent to the N-type semiconductor region 1802 of the PD 1201. The P-type semiconductor region 1820 may be connected to the P-type well 1819 and be provided with the ground voltage GND. The P-type semiconductor region 1820 may reduce a noise caused by a dark current generated at the interface of the semiconductor substrate and an insulator.

In case the transistors which included in the pixel circuit have the same conductivity type, a single conductivity type of a well may be used in the pixel as shown in FIG. 19. Therefore, the fill factor of the pixel, which is a ratio of a region that the photoelectric conversion unit occupies to a region of a single pixel, may be improved.

In the present embodiment, the PD 1201 which accumulates the electron may be formed by providing N-type semiconductor region 1802 in the P-type well 1819. In this case, since the photoelectric conversion unit and the transistors may be provided in the same well, the fill factor of the pixel may be improved. Therefore, sensitivity and/or a saturation amount of charges may be improved. When hole is used as the signal charge, P-type channel transistors may be used, and vice versa.

If two wells having different conductive type from each other are provided, a PN junction may be formed between the two wells. In this case, the elements are provided with a distance from the PN junction in order to avoid the influence the electrical field caused by the PN junction may impose on.

As shown in FIG. 19, light may enter the semiconductor substrate in a direction indicated by L. That is, the photoelectric conversion device illustrated in FIG. 19 is a front-side illuminated type.

Figure 20:
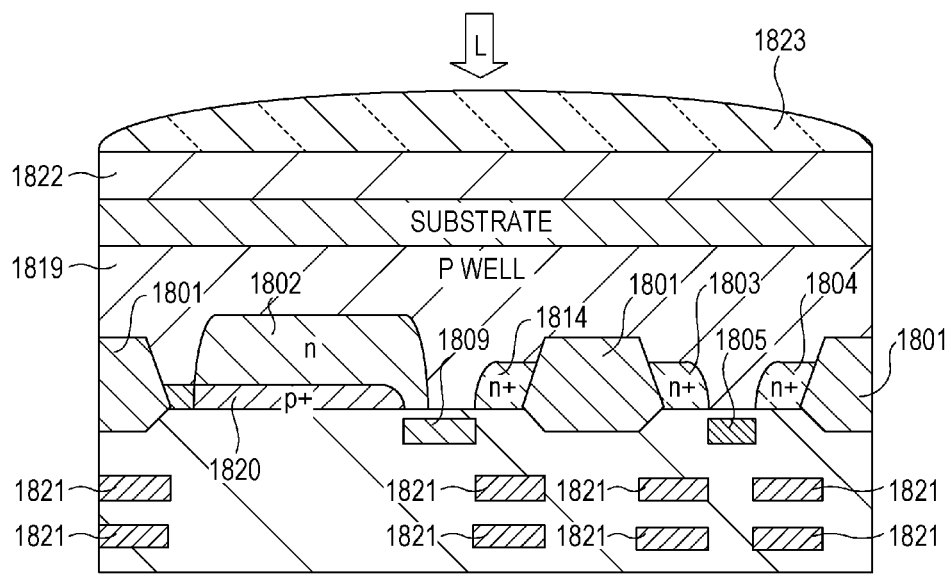
FIG. 20 is a schematic illustration of the cross-sectional structure of an exemplary pixel of an exemplary embodiment.

FIG. 20 is a schematic illustration of another exemplary cross-sectional structure taken along a line A-B in FIG. 18. The PD 1201, the transfer transistor 1204 and the first input transistor 1202 are exemplarily illustrated in FIG. 20.

The photoelectric conversion device illustrated in FIG. 20 is a back-side illuminated type. In detail, light may enter the semiconductor substrate from a side (back side) opposite to a side (front side) on which the gate electrodes of the transistors are provided. L in FIG. 20 indicates a direction in which light may enter the semiconductor substrate.

The same reference symbol is used to indicate elements in FIG. 20 and FIG. 19 which perform the same or a similar function, and detailed descriptions of the elements are not repeated. A conductive member 1821 included in an interconnection is shown in FIG. 20. Further, a color filter 1822 and a lens 1823 may be provided on the back side of the semiconductor substrate.

In the back-side illuminated type photoelectric conversion device, conductive members and gate electrodes, which may shield incident light, may be reduced on a side (back side) though which the incident light may enter the semiconductor substrate. Accordingly, sensitivity may be improved.

The photoelectric conversion device of the present embodiment may include a second semiconductor substrate. The second semiconductor substrate may include transistors in the circuit for reading out the current signal from the pixels or the signal processing circuit. The second semiconductor substrate may be provided on a first side of the conductive member 1821, the first side being opposite to a second side of the conductive member 1821 on which the PD 1201 is provided. In another aspect of view, the (first) semiconductor substrate where the PD 1201 is provided and the second semiconductor substrate where the transistors are provided may be arranged so as to face to each other with the conductive member included in the interconnection therebetween. In this case, the fill factor of the pixel may be improved by reduction of the number of the pixel transistors which are provided in the same semiconductor substrate as the PD 1201.

Figure 15:
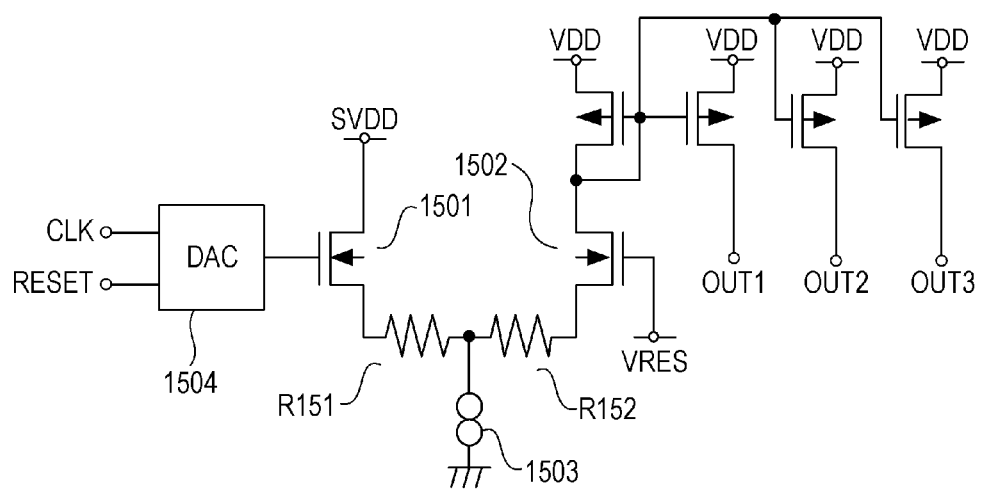
FIG. 15 illustrates an equivalent circuit of an exemplary ramp current signal source of an exemplary embodiment.

Hereinafter, an exemplary structure of the ramp current signal source 1109 will be described in detail. FIG. 15 illustrates an equivalent circuit of the ramp current signal source 1109 of the present embodiment. The ramp current signal source 1109 may include a current output circuit and a current mirror circuit. The current output circuit may output a current corresponding to an input voltage. The current mirror may dispense the current from the current output circuit to a plurality of the comparators 1108.

The current output circuit included in the ramp current signal source 1109 of the present embodiment may be a differential amplifier. The differential amplifier of the ramp current signal source 1109 may include a third input transistor 1501 and a fourth input transistor 1502. The third input transistor 1501 and the fourth input transistor 1502 may form a differential pair. The sources of the third and fourth input transistors 1501 and 1502 are electrically connected to a bias current source 1503 respectively via resistors R151 and R152. The drain of the third input transistor 1501 may be provided with the power source voltage SVDD. The drain of the fourth input transistor 1502 is electrically connected to the current mirror circuit of the ramp current signal source 1109.

The gate of the third input transistor 1501 is electrically connected to a DAC (Digital to Analog Convertor) 1504. The DAC 1504 outputs a voltage signal, whose amplitude may vary step-by-step according to a clock signal CLK. According to the drive signal RESET provided for the DAC 1504, the voltage signal is reset to an initial value. The gate of the second input transistor 1502 is provided with the reset voltage VRES.

The drain current of the second input transistor 1502 may vary on the basis of the voltage signal the DAC 1504 outputs. The drain current of the second input transistor 1502 may be the ramp current signal.

The current mirror circuit of the ramp current signal source 1109 mirrors the drain current of the second input transistor 1502 and input mirrored currents to the plurality of the comparators 1108. An OUT1 node is electrically connected to the reference current input node 1111 of the comparator 1108 provided for the leftward column in FIG. 11. An OUT2 node is electrically connected to the reference current input node 1111 of the comparator 1108 provided for the middle column in FIG. 11. An OUTS node is electrically connected to the reference current input node 1111 of the comparator 1108 provided for the rightward column in FIG. 11. The number of output-side transistors of the current mirror circuit of the ramp current signal source 1109 may correspond to the number of the comparators 1108. In another case, the ramp current signal source 1109 may be provided for each of the plurality of the comparators 1108. In this case, the current mirror circuit for dispensing the ramp current signals may be omitted.

The current output circuit included in the ramp current signal source 1109 may have the same structure as, or a similar structure to the pixel amplification unit. In the present embodiment, the same differential amplifier is used for the ramp current signal source 1109. Further, the ramp current signal source 1109 may include a dummy transistor, which may correspond to the pixel transistor such as the reset transistor, the selection transistor or the connection transistor. In detail, the ramp current signal source 1109 may be a circuit which substitutes the DAC 1504 for the PD 1201 of the circuit illustrated in any one of FIGS. 12, 13 and 14. In the case where the current output circuit included in the ramp current signal source 1109 has the same structure as, or a similar structure to the pixel amplification unit, linearity in analog to digital conversion may be improved.

In another exemplary ramp current signal source 1109, a voltage source including a constant current source and a capacitor may substitute for DAC 1504. Since the constant current source is configured to charge the capacitor by a constant current, a voltage signal, whose amplitude may be continuously variable, may emerge at the capacitor. Accordingly, the ramp current signal source 1109 outputs the ramp current signal, whose amplitude may be continuously variable.

The direction in which the ramp current signal varies, i.e. upward or downward, may be determined in accordance with the conductivity type of the signal charge and the conductivity type of the input transistors 1202, 1203. The amplitude of the ramp current signal may vary in a direction from amplitude of the current signal that the pixel 1101 outputs in a dark situation to amplitude of the current signal that the pixel 1101 outputs in a bright situation. The dark situation may include a situation where the voltage of the node 1208 has been reset and charges are not transferred to the node 1208.

In FIGS. 12, 13 and 14, the electron is used as the signal charge, and is transferred to the node 1208, which is the gate of the first input transistor 1202. The transfer of the electron may lower the voltage of the node 1208. The more the charges are transferred, the lower the voltage of the node 1208 may become. Since, in the bright situation, a large amount of charges may be transferred to the node 1208, the voltage of the node 1208 may be low. Since the input transistors 1202, 1203 have N-type channels, the amplitude of the current signal may be larger in the bright situation than in the dark situation. In this case, the ramp current signal whose amplitude varies from small to large (or upward) may be used.

In another case, the electron of the PD 1201 may be transferred to the gate of the second input transistor 1203. In this case, the more the charges are transferred, the smaller the amplitude of the current signal may become. Thus, the ramp current signal whose amplitude varies from large to small (or downward) may be used.

In the case where the hole is used as the signal charge, the above mentioned direction in which the amplitude of the ramp current signal varies may be inverted. Further, the case where the input transistors 1202, 1203 have P-type channels, the above mentioned direction in which the amplitude of the ramp current signal varies may be inverted.

Figure 16:
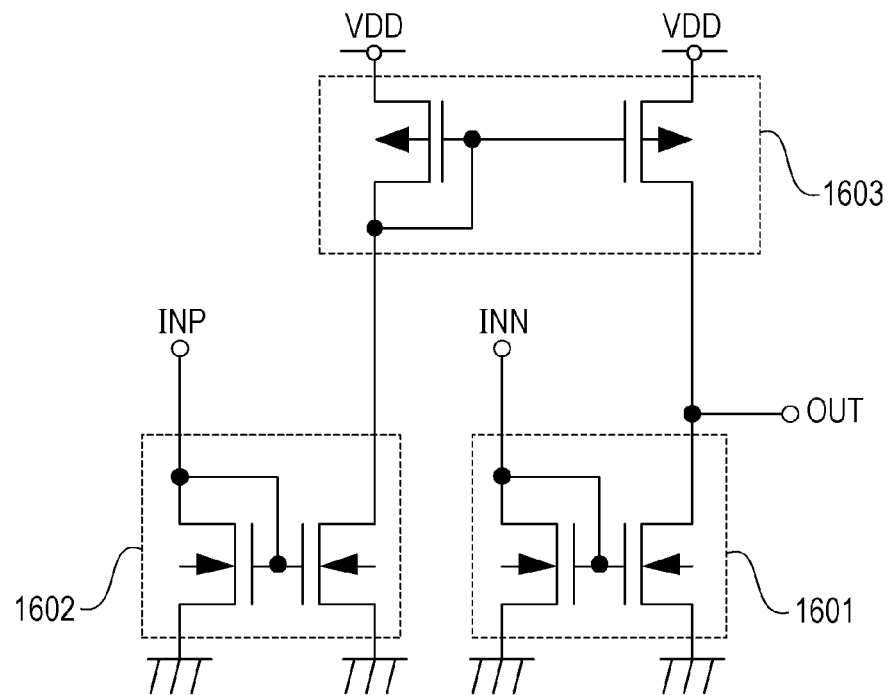
FIG. 16 illustrates an equivalent circuit of an exemplary comparator of an exemplary embodiment.

Hereinafter, an exemplary structure of the comparator 1108 will be described in detail. FIG. 16 illustrates an equivalent circuit of the comparator 1108 according to one or more embodiments. The comparator 1108 may transmit the current signal input to the signal input node 1110 and the reference current signal input to the reference current input node 1111 to the output node 1112. According to the amplitude relationship of the current signals, the comparator 1108 may vary the voltage of the output node 1112.

In FIG. 16, an INN node corresponds to the signal input node 1110. An INP node corresponds to the reference current input node 1111. An OUT node corresponds to the output node 1112.

When a current is input to the INN node, the current may be transmitted to the OUT node via a first current mirror circuit 1601. When a current is input to the INP node, the current may be transmitted to the OUT node via a second current mirror circuit 1602 and a third current mirror circuit 1603.

The OUT node is electrically connected to a ground voltage line via an output-side transistor of the first current mirror circuit 1601. Further, the OUT node is electrically connected to a power source voltage line via an output-side transistor of the third current mirror circuit 1603.

The current input via the INN node (the current signal from the pixel 1101) may discharge the OUT node. On the other hand, the current input via the INP node (the ramp current signal) may charge up the OUT node.

When the current signal from the pixel 1101 is larger than the ramp current signal, the voltage of the OUT node may be or get closer to the ground voltage GND (a first voltage). When the ramp current signal is larger than the current signal from the pixel 1101, the voltage of the OUT node may be or get closer to the power source voltage VDD (a second voltage).

The current signals are transmitted to the OUT node via the current mirror circuits 1601, 1602 and 1603. Since the OUT node has two transistors connected thereto, the capacitance of the OUT node may be reduced. Therefore, when the amplitude relationship of the current signal from the pixel 1101 and the ramp current signal is inverted, the voltage of the output node (the OUT node) of the comparator 1108 may quickly change. Thus, speed in analog to digital conversion may be improved.

In FIG. 16, each of the current input via the INN node and the current input via the INP node is transmitted to the OUT node via the current mirror circuit. In this case, the two transistors, which connected to the OUT node, may be arranged to be close to each other. Accordingly, a short wire may be used for the OUT node. Thus, the capacitance of the OUT node may be reduced.

Figure 17:
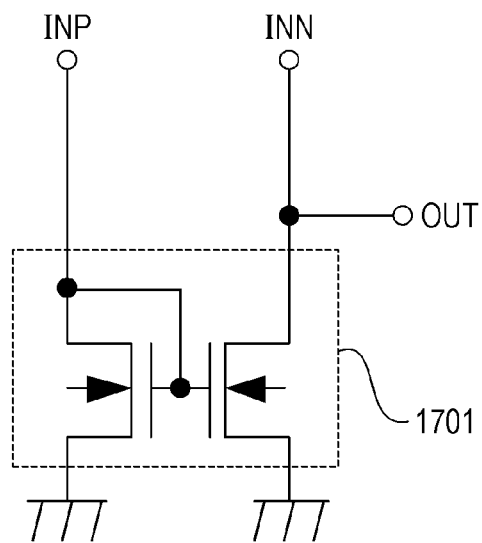
FIG. 17 illustrates an equivalent circuit of an exemplary comparator of an exemplary embodiment.

Hereinafter, another exemplary structure of the comparator 1108 will be described in detail. FIG. 17 illustrates an equivalent circuit of the comparator 1108 according to one or more embodiments. In FIG. 17, an INN node corresponds to the signal input node 1110. An INP node corresponds to the reference current input node 1111. An OUT node corresponds to the output node 1112.

The INN node may be the OUT node. Thus, the voltage of the second output line 1107 which is electrically connected to the INN node may vary according to the amplitude relationship of the current signals.

Although the first output line 1104 is electrically connected to the plurality of the pixels 1101, the second output line 1107 is electrically connected to the first output line 1104 via the current mirror circuit. Accordingly, only the output-side transistor 1106 of the current mirror circuit may be connected to the second output line 1107. Thus, even in the case where the second output line 1107 and the output node 1112 are the same node, speed in analog to digital conversion may be improved.

The current input to the INP node may be transmitted to the OUT node via only the first current mirror circuit 1701. Thus, the A-D convertor may be reduced in scale.

In the comparator 1108 illustrated in FIG. 17, the current input via the INN node (the current signal from the pixel 1101) may charge up the OUT node. On the other hand, the current input via the INP node (the ramp current signal) may discharge the OUT node.

When the current signal from the pixel 1101 is larger than the ramp current signal, the voltage of the OUT node may be or get closer to power source voltage VDD (a first voltage). When the ramp current signal is larger than the current signal from the pixel 1101, the voltage of the OUT node may be or get closer to the ground voltage GND (a second voltage).

Figure 21:
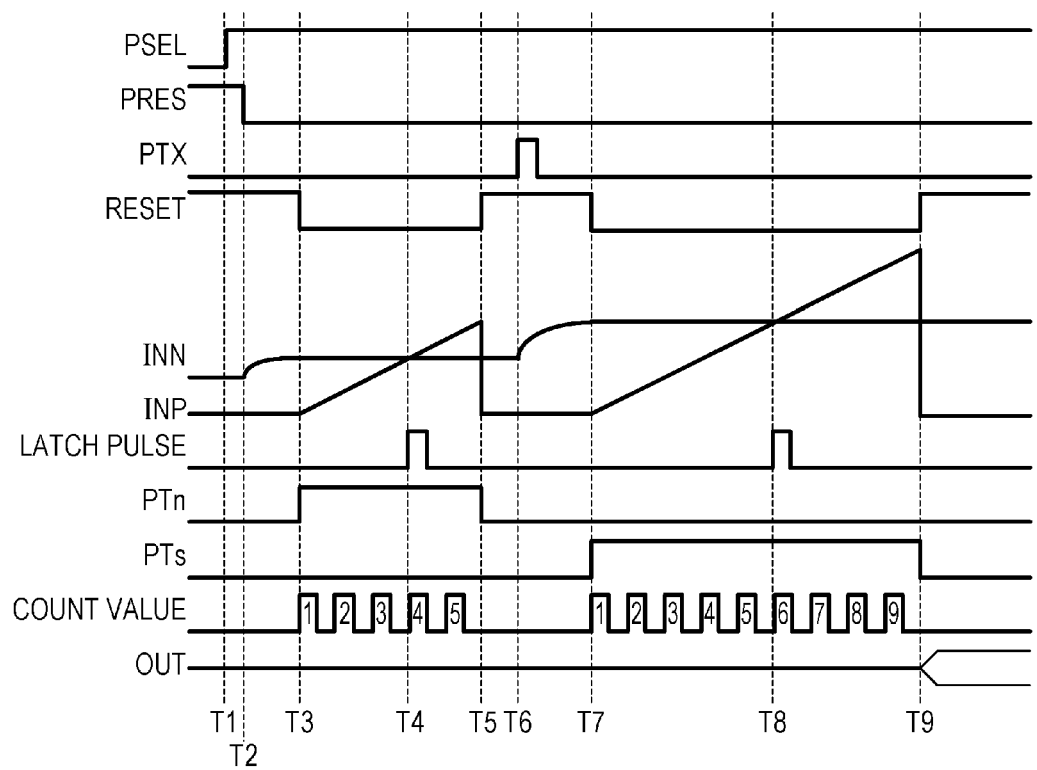
FIG. 21 is a timing chart of an exemplary operation for an exemplary embodiment.

Hereinafter, an exemplary operation for the photoelectric conversion device according to one or more embodiments will be described. FIG. 21 is a timing chart of the drive signals. The drive signals PSEL, PRES, PTX, PTN and PTS, illustrated in FIG. 21, are respectively provided for the PSEL node, the PRES node, the PTX node, the PTN node and the PTS node, illustrated in FIG. 11.

The drive signal RESET represents the ramp reset signal, which is provided for the RESET node of the ramp current signal source 1109, and the counter reset signal, which is provided for the RESET node of the counter 1116. Since the ramp reset signal and the counter reset signal may synchronize with each other, the drive signal RESET in FIG. 21 represents both of the two signals. In another case, provided may be the ramp reset signal and the counter reset signal, which are not synchronized.

FIG. 21 illustrates the current signal INN, which is input to the signal input node 1110 (INN node) of the comparator 1108, and the ramp current signal INP, which is input to the reference current input node 1111 (INP node) of the comparator 1108. Further, FIG. 21 illustrates the latch pulse that the patch pulse generator 1113 outputs and the count value that the counter 1116 outputs.

Each of the drive signals may have at least two values which correspond to a high level and a low level. In analog circuits, the high level of the drive signal may turn on the corresponding transistor. The low level of the drive signal may turn off the corresponding transistor.

Before T1, the PRES and RESET are of high levels. The other drive signals are of low levels. At this time, the reset voltage VRES is provided for the node 1208 and the gate of the second input transistor 1203. Since the drive signal RESET is a high level, each of the ramp current signal source 1109 and the counter 1116 is in a state of being reset, or of outputting the initial value.

At T1, the PSEL turns into a high level, whereby the pixel may be selected. Thus, the current signal according to the voltage of the input node of the pixel amplification unit may be output via the OUT node.

At T2, the PRES turns into a low level, whereby the node 1208 may become electrically floating. In the pixel illustrated in FIG. 13, the node 1208 and the gate of the second input transistor 1203 may become electrically floating.

At T3, the RESET turns into a low level, and the PTN turns into a high level. With the RESET's turning into the low level, the amplitude of the ramp current signal may start to change from the initial value. In the present embodiment, the amplitude of the ramp current signal may change upward. Further, the counter 1116 may start to count at this time.

At T3, the voltage of the input node (node 1208) of the pixel amplification unit is the reset voltage VRES. Accordingly, a current signal that the pixel outputs when in a state of being reset is compared with the ramp current signal. The current signal that the pixel outputs when in a state of being reset may contain a reset nose, which is generated when the reset transistor turns off.

At the inversion of the amplitude relationship between the ramp current signal and the current signal from the pixel (at T4), the latch pulse is input to the N latch circuit 1114, whereby the N latch circuit 1114 may store the count value at T4.

At T5, the RESET turns into a high level, whereby the ramp current signal source 1109 and the counter 1116 are reset. Then, the PTN turns into a low level.

At T6, the PTX turns into a high level, whereby the charge generated at PD 1201 may be transferred to the node 1208. At this time, the whole charges of the PD 1201 may be transferred to the node 1208. After a period passes since T6, the PTX turns into a low level.

By the transfer of the charges to the node 1208, the voltage of the node 1208 may change from the reset voltage VRES. The amount of the voltage change may be defined by the amount of the charges transferred. On the other hand, the voltage of the gate of the second input transistor 1203 may be kept at the reset voltage VRES. Thus, the voltage difference according to the amount of the charges may emerge between the two input nodes of the differential amplifier, and the differential amplifier may output the current signal according to the voltage difference.

At T7, the RESET turns into a low level, and the PTN turns into a high level. With the RESET's turning into the low level, the amplitude of the ramp current signal may start to change from the initial value. Further, the counter 1116 may start to count at this time. Since the PTN is the high level, the count value from the counter 1116 is input to the S latch circuit 1115.

At T7, the voltage of the input node (node 1208) of the pixel amplification unit is a voltage corresponding to the amount of the charges generated by the incident light. Accordingly, a current signal corresponding to the amount of the incident light is compared with the ramp current signal. The current signal corresponding to the amount of the incident light may contain a reset nose, which is generated when the reset transistor turns off.

At the inversion of the amplitude relationship between the ramp current signal and the current signal from the pixel (at T8), the latch pulse is input to the S latch circuit 1115, whereby the S latch circuit 1115 may store the count value at T8.

At T9, the RESET turns into a high level, and then the analog to digital conversion may be accomplished. From T9, the output portion may start to output the digital signals.

In the pixel corresponding to FIG. 13, a timing of turning off the reset transistor 1209 and a timing of turning off the connection transistor 1210 may be offset. In detail, the reset transistor 1209 turns off before the connection transistor 1210 turns off. By this order of the operation, the reset noises, which is generated when the reset transistor 1209 turns off, may be substantially equally divided into the two input nodes. As the result, since the divided noises may cancel each other by the differential amplification, noises in the current signal may be reduced.

The read out of the current signal that the pixel outputs when in a state of being reset may be omitted. Even though the read out of the current signal that the pixel outputs when in a state of being reset is omitted, an offset noise of the pixel and the reset noise may be reduced because the pixel amplification unit is the differential amplifier. However, with the read out of the current signal that the pixel outputs when in a state of being reset, offset noises generated in the subsequent states of the pixel may be reduced.

Hereinafter, another exemplary operation for the photoelectric conversion device according to one or more embodiments will be described. In this operation, the drive signal PSEL may be provided parallel for the pixels in a plurality of the pixel rows. Thus, the pixels in the plurality of the pixel rows may simultaneously output the current signals to the same first output line 1104. According to this way of operation, the current signals may be summed up or averaged at the first output line 1104. In this case, each of the drive signals PSEL, PRES, PTX may be provided for the pixels in the plurality of the pixel rows simultaneously.

For addition of two current signals from two pixels, the bias current source 1102 may output the bias current which has the amplitude twice as large as that of the bias current the bias current source 1102 may output when the current signal from a single pixel is individually output. Then each of the differential amplifiers of the two pixels may be provided with the bias current as large as that provided when the current signal from a single pixel is individually output. Accordingly, the current signals to be added to each other, or summed up, may have respectively the same amplitude as output individually. In the case where the current signals from more than two pixels are summed up, the bias current may be turned up in accordance with the number of the signals to be summed up. For the average of the current signals, the bias current may be set in the same amplitude when the current signal from a single pixel is being output.

The current signal from the pixel may be amplified or attenuated in the analog to digital conversion by controlling the amplification factor of the current mirror circuit of the ramp current signal source 1109. In the case where two current signals are added, for example, the amplification factor may be set in two.

As described above, the pixel includes the differential amplifier. And, the transistors included in pixel have the same conductivity type. Thus, in one or more embodiments, sensitivity may be improved.

As described above, in the present embodiment, the current signal from the pixel is mirrored by the current mirror circuit, and the mirrored signal is compared with the ramp current signal. According to the embodiment, it may be possible to compare the current signal from each of the signal sources with the reference current signal even though those signal sources are not connected to the comparator, especially the output node of the comparator. It may be possible to reduce the parasitic capacitance of the output node, where a voltage signal representing a result of the comparison may be output. Hence, the comparison of the current signals may be conducted in a short time.

In the present embodiment, the A-D convertor is provided for each pixel column. In the A-D convertor, the voltage of the output node may change from the first voltage to the second voltage (or otherwise) when the amplitude relationship of the current signal from the pixel and the ramp current signal is inverted. In other words, the voltage of the output node may be inverted. If it takes long to invert the voltage of the output node since the inversion of the amplitude relationship, the generation of the latch pulse may be delayed. Since the counter may continue to count up because of the delay of the latch pulse, the latch circuit may store a wrong count value. For prevention the above mentioned error, a clock signal of a low frequency may be used, which results in a deterioration in the speed of the analog to digital conversion.

On the contrary, in the present embodiment, since the parasitic capacitance of the output node may be reduced, the voltage of the output node may be quickly inverted. As a result, the above mentioned error may be reduced when a clock signal of a high frequency is used. Hence, speed of the analog to digital conversion may be improved.

Fourth Exemplary Embodiment

Figure 22:
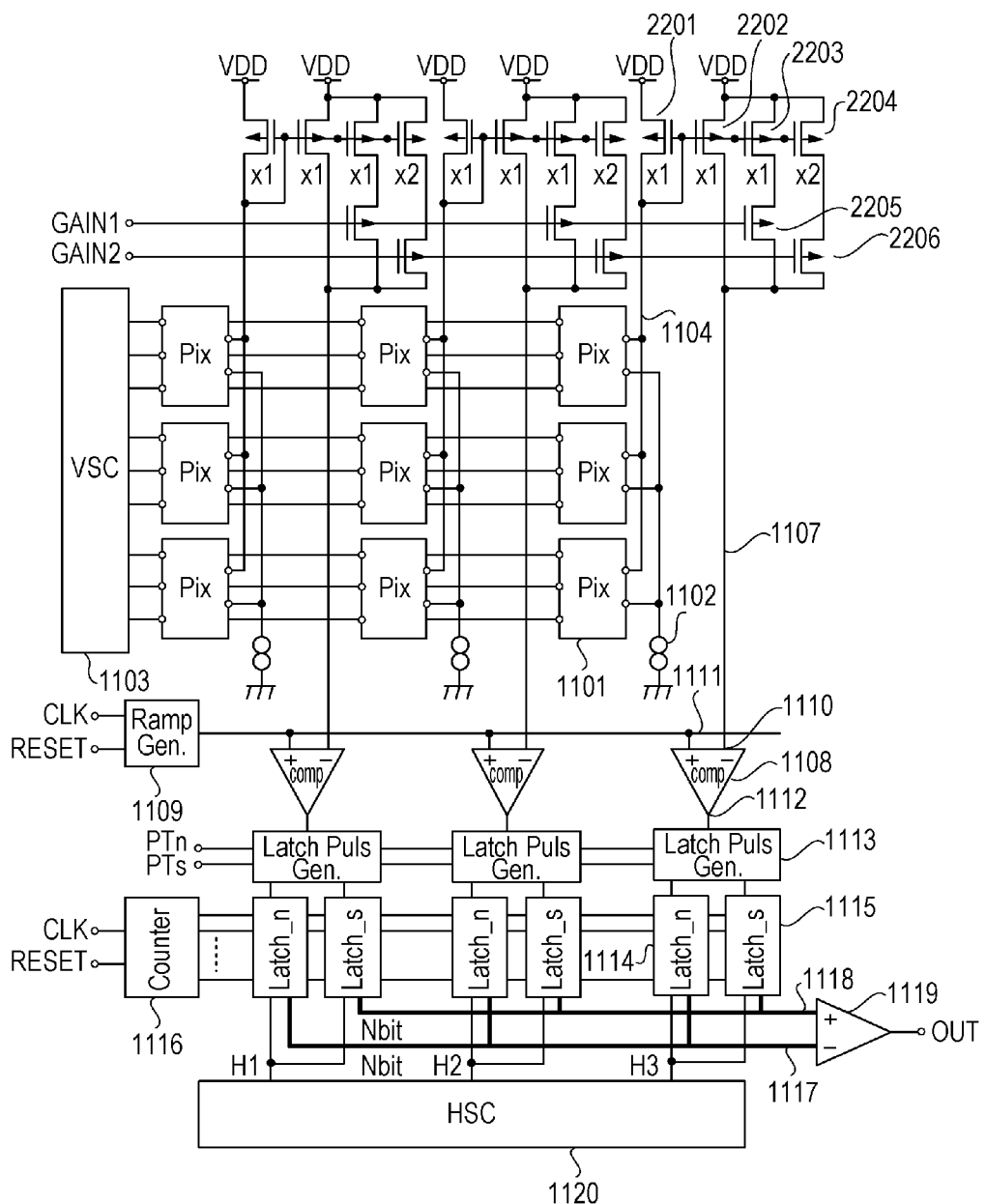
FIG. 22 illustrates an equivalent circuit of a fourth exemplary embodiment.

FIG. 22 illustrates an equivalent circuit of a photoelectric conversion device according to one or more embodiments. The same reference symbol is used to indicate elements in FIG. 22 and FIG. 11 which perform the same or a similar function, and detailed descriptions of the elements are not repeated.

The photoelectric conversion device of the present embodiment includes a plurality of pixels, a current mirror circuit, an analog to digital convertor (A-D convertor), an output portion, a vertical scanning circuit and a horizontal scanning circuit. In each of the pixels, incident light may be converted into a charge. The vertical scanning circuit provides the pixels with drive signals. In accordance with the drive signals, a current signal corresponding to the amount of charges generated by the photoelectric conversion unit is output from the pixel. The current signal from the pixel is input to the A-D convertor via the current mirror circuit. The A-D convertor converts the current signal, which is output from the pixel as an analog signal, into a digital signal. According to drive signals the horizontal scanning circuit provides, the digital signal is read out to the output portion. The output portion outputs the digital signal to the outside of the device.

In the present embodiment, the amplification factor of the current mirror circuit is controllable. The other features may be the same as the above described embodiment. The detailed explanation of the same features as the above described embodiment is not repeated.

The current mirror circuit includes an input-side transistor 2201 and three output-side transistors 2202, 2203 and 2204. The input and output-side transistors 2201, 2202, 2203, 2204 are P-type channel MOS transistors.

The gate and the drain of the input-side transistor 2201 are shorted. The source of the input-side transistor 2201 is electrically connected to a power source line. The power source line may provide the source of the input-side transistor 2201 with a power source voltage VDD. The first output line 1104 is electrically connected to the drain of the input-side transistor 2201 and the gate which is shorted to the drain of the input-side transistor 2201.

The output-side transistors 2202, 2203 and 2204 are arranged in parallel. In detail, the sources of the output-side transistors 2202, 2203 and 2204 are respectively connected to the power source line. The power source line may provide the sources of the output-side transistors 2202, 2203 and 2204 with the power source voltage VDD. The gates of the output-side transistors 2202, 2203 and 2204 are respectively connected to the gate of the input-side transistor 2201. The drains of the output-side transistors 2202, 2203 and 2204 are respectively connected to the second output line 1107.

The input-side transistor 2201 and the first and second output-side transistors have the substantially same channel widths. The third output-side transistor 2204 has twice as a wide channel width as the input-side transistor 2201. The input and output-side transistors 2201, 2202, 2203 and 2204 have the substantially same channel length.

A first gain control switch 2205 is arranged in an electrical path between the drain of the second output-side transistor 2203 and the second output line 1107. The first gain control switch 2205 is a P-type channel MOS transistor. A drive signal GAIN1 may control the first gain control switch 2205 to be turned on or off.

A second gain control switch 2206 is arranged in an electrical path between the drain of the third output-side transistor 2204 and the second output line 1107. The second gain control switch 2206 is a P-type channel MOS transistor. A drive signal GAIN2 may control the second gain control switch 2206 to be turned on or off.

The first and second gain control switches 2205 and 2206 may control the amplification factor of the current mirror circuit. The first and second gain control switches 2205 and 2206 may be included in an amplification factor control portion. By the two gain control switches 2205 and 2206, four of gains are to be set.

When both of the first and second gain control switches 2205 and 2206 are turned off, the second and third output-side transistors 2203 and 2204 are disconnected from the second output line 1107. Accordingly, only the first output-side transistor 2202 of the three may be connected to the second output line 1107. In this case, the mirrored current signal may be output at the amplification factor of about 1.

When the first gain control switch 2205 is turned on and the second gain control switch 2206 is turned off, the third output-side transistors 2204 is disconnected from the second output line 1107. Accordingly, the first and second output-side transistors 2202 and 2203 of the three may be connected to the second output line 1107. Since the output-side transistors are arranged in parallel, a virtual output-side transistor which has twice as a wide channel width as the input-side transistor 2201 may be considered. In this case, the mirrored current signal may be output at the amplification factor of about 2.

When the first gain control switch 2205 is turned off and the second gain control switch 2206 is turned on, the second output-side transistors 2203 is disconnected from the second output line 1107. Accordingly, the first and third output-side transistors 2202 and 2204 of the three may be connected to the second output line 1107. Since the output-side transistors are arranged in parallel, a virtual output-side transistor which has three times as a wide channel width as the input-side transistor 2201 may be considered. In this case, the mirrored current signal may be output at the amplification factor of about 3.

When both of the first and second gain control switches 2205 and 2206 are turned on, all of the three output-side transistors 2202, 2203 and 2204 may be connected to the second output line 1107. Since the output-side transistors are arranged in parallel, a virtual output-side transistor which has four times as a wide channel width as the input-side transistor 2201 may be considered. In this case, the mirrored current signal may be output at the amplification factor of about 4.

As mentioned above, the amplification factor of the current mirror circuit is controllable.

In FIG. 22, three output-side transistors are arranged. However, the number of the output-side transistors is not limited to three. According to the size of each of the transistors, the amplification factor may be determined.

In the case where the current signals from the pixels are individually output, the amplification factor may be changed. For example, the amplification factor may be controlled to be large when the current signal from the pixel has a small amplitude, while being small when the current signal from the pixel has a large amplitude.

The amplification factor may be changed between the case where the current signal from a single pixel is output and the case where the current signals from a plurality of the pixels are simultaneously output. For adding or averaging the current signals, a small amplification factor may be used. The small amplification factor may result in a large dynamic range at the subsequent stages.

An exemplary structure of the pixel may be the same as the above described embodiment. The equivalent circuit of the pixel is illustrated in FIG. 12, 13 or 14. The exemplary planar and cross-sectional structures of the pixel are illustrated in FIGS. 18, 19 and 20.

An exemplary operation for the photoelectric conversion device according to the present embodiment may be the same as the above described embodiment. The photoelectric conversion device may be operated according to the drive signals illustrated in FIG. 21.

In the present embodiment, since the amplification factor of the current mirror circuit is controllable, a wide dynamic range and a high signal-to-noise ratio (SN ratio) may be obtained. For capturing a dark object, improvement in SN ratio may be obtained because of a high gain of the current mirror circuit. For capturing a bright object, which is less effected by noises, improvement in dynamic range may be obtained because of a low gain of the current mirror circuit.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Applications No. 2011-274889 filed Dec. 15, 2011, which is hereby incorporated by reference herein in its entirety.

What is claimed is:
1. A photoelectric conversion device comprising:
a plurality of photoelectric conversion units; and
a readout portion configured to output current signals to an output line, each of the current signals being based on an amount of charges generated by a corresponding one of the photoelectric conversion units;
wherein the readout portion includes a plurality of transistors including at least a plurality of first input transistors and a plurality of second input transistors, each of the first input transistors and a corresponding one of the second input transistor forming a differential pair, wherein the plurality of transistors include a plurality of first selection transistors, each of the first selection transistors being electrically connected to a source of a corresponding one of the first input transistors and a source of a corresponding one of the second input transistors, wherein the plurality of the first selection transistors are repeatedly arranged correspondingly to every one or more of the photoelectric conversion units, wherein the plurality of transistors include a plurality of second selection transistors, each of the second selection transistors being electrically connected to a drain of a corresponding one of the second input transistors, wherein the plurality of the second selection transistors are repeatedly arranged correspondingly to every one or more of the photoelectric conversion units, and wherein, of the plurality of the transistors, any transistors repeatedly arranged correspondingly to every one or more of the photoelectric conversion units have the same conductivity type.

2. The photoelectric conversion device according to claim 1,
wherein a plurality of transfer transistors are included in the plurality of the transistors, each of the transfer transistors being configured to transfer a generated charge by a corresponding one of the photoelectric conversion units to a corresponding one of the first input transistors, and
wherein the plurality of the transfer transistors are repeatedly arranged correspondingly to every one or more of the photoelectric conversion units.

3. The photoelectric conversion device according to claim 2, wherein charges of two or more of the photoelectric conversion units are to be transferred to a common first input transistor.

4. The photoelectric conversion device according to claim 1,
wherein the plurality of the first selection transistors and the plurality of the second selection transistors are configured to select the photoelectric conversion unit for outputting the current signal from the plurality of the photoelectric conversion units.

5. The photoelectric conversion device according to claim 4,
wherein the plurality of transistors include a plurality of third selection transistors, each of the third selection transistors being electrically connected to a drain of a corresponding one of the first input transistors,
wherein the plurality of the third selection transistors are repeatedly arranged correspondingly to every one or more of the photoelectric conversion units, and
wherein the plurality of the first selection transistors, the plurality of the first selection transistors and the plurality of the third selection transistors are configured to select the photoelectric conversion unit for outputting the current signal from the plurality of the photoelectric conversion units.

6. The photoelectric conversion device according to claim 1, further comprising a reset voltage providing unit configured to provide a reset voltage for an input node of the first input transistor and an input node of the second input transistor;
wherein a plurality of first reset transistors are included in the plurality of the transistors, each of the first reset transistors being configured to control an electrical connection between the reset voltage providing unit and the input node of a corresponding one of the first input transistors, and wherein the plurality of the first reset transistors are repeatedly arranged correspondingly to every one or more of the photoelectric conversion units.

7. The photoelectric conversion device according to claim 6,
wherein a plurality of connection transistors are included in the plurality of the transistors, each of the connection transistors being configured to control an electrical connection between the input node of a corresponding one of the first input transistors and the input node of a corresponding one of the second input transistors, and
wherein the plurality of the connection transistors are repeatedly arranged correspondingly to every one or more of the photoelectric conversion units.

8. The photoelectric conversion device according to claim 6,
wherein a plurality of second reset transistors are included in the plurality of the transistors, each of the second reset transistors being configured to control an electrical connection between the reset voltage providing unit and the input node of a corresponding one of the second input transistors, and
wherein the plurality of the second reset transistors are repeatedly arranged correspondingly to every one or more of the photoelectric conversion units.

9. The photoelectric conversion device according to claim 1,
wherein the plurality of the photoelectric conversion units are configured to simultaneously output, to the output line, the current signals from two or more of photoelectric conversion units, and
wherein the output line is configured such that the current signals simultaneously output to the output line are summed up at the output line.

10. The photoelectric conversion device according to claim 9, further comprising a bias current source configured to provide each of the first input transistors and each of the second input transistors with a bias current,
wherein the bias current source is configured to provide a first bias current when the current signal from one of the photoelectric conversion units individually being output, and to provide a second bias current, having a larger amplitude than that of the first bias current, when the current signals from two or more of the photoelectric conversion units simultaneously being output.

11. The photoelectric device according to claim 1, further comprising a first semiconductor substrate,
wherein the photoelectric conversion unit is provided in the first semiconductor substrate,
wherein an interconnection connected to the first or second input transistor is provided on a first surface of the first semiconductor substrate, and
wherein the photoelectric conversion unit is configured to convert incident light from a second surface of the first semiconductor substrate, opposite to the first surface, into a charge.

12. The photoelectric conversion device according to claim 11, further comprising a second semiconductor substrate facing to the first surface of the first semiconductor substrate,
wherein the interconnection is provided between the first and second semiconductor substrates, and
wherein at least part of the transistors are provided in the second semiconductor substrate.

13. A photoelectric conversion device comprising an output line and a plurality of pixels,
wherein each of the pixels includes a photoelectric conversion unit, and a plurality of transistors including at least a first input transistors and a second input transistor, the first input transistors and the second input transistor forming a differential pair, wherein each of the pixels is configured to output, to the output line, a current signal based on an amount of charges generated by the photoelectric conversion unit, wherein all transistors included in the pixel have the same conductivity type, wherein the plurality of transistors of each pixel includes a first selection transistor electrically connected to a source of the first input transistor and a source of the second input transistor, and wherein the plurality of transistors of each pixel includes a second selection transistor electrically connected to a drain of the second input transistor.

14. The photoelectric conversion device according to claim 13, wherein the plurality of transistors of each pixel includes a third selection transistor electrically connected to a drain of the first input transistor.

15. A photoelectric conversion device comprising:

a plurality of photoelectric conversion units; and a readout portion configured to output current signals to an output line, each of the current signals being based on an amount of charges generated by a corresponding one of the photoelectric conversion units;

wherein the readout portion includes a plurality of transistors including at least a plurality of first input transistors and a plurality of second input transistors, each of the first input transistors and a corresponding one of the second input transistor forming a differential pair, wherein, of the plurality of the transistors, any transistors repeatedly arranged correspondingly to every one or more of the photoelectric conversion units have the same conductivity type, wherein a plurality of selection transistors are included in the plurality of the transistors, each of the selection transistors being configured to select the photoelectric conversion unit for outputting the current signal from the plurality of the photoelectric conversion units, wherein the plurality of the selection transistors are repeatedly arranged correspondingly to every one or more of the photoelectric conversion units, wherein the plurality of the selection transistors include a plurality of first selection transistors, each of the first selection transistors being electrically connected to a source of a corresponding one of the first input transistors and a source of a corresponding one of the second input transistors, wherein the plurality of the selection transistors include a plurality of second selection transistors, each of the second selection transistors being electrically connected to a drain of a corresponding one of the first input transistors, and wherein the plurality of the selection transistors include a plurality of third selection transistors, each of the third selection transistors being electrically connected to a drain of a corresponding one of the second input transistors.

16. A photoelectric conversion device comprising:

a plurality of photoelectric conversion units; and a readout portion configured to output current signals to an output line, each of the current signals being based on an amount of charges generated by a corresponding one of the photoelectric conversion units;

wherein the readout portion includes a plurality of transistors including at least a plurality of first input transistors and a plurality of second input transistors, each of the first input transistors and a corresponding one of the second input transistor forming a differential pair, wherein, of the plurality of the transistors, any transistors repeatedly arranged correspondingly to every one or more of the photoelectric conversion units have the same conductivity type, wherein the photoelectric conversion device further comprises a reset voltage providing unit configured to provide a reset voltage for an input node of the first input transistor and an input node of the second input transistor;

wherein a plurality of first reset transistors are included in the plurality of the transistors, each of the first reset transistors being configured to control an electrical connection between the reset voltage providing unit and the input node of a corresponding one of the first input transistors, wherein the plurality of the first reset transistors are repeatedly arranged correspondingly to every one or more of the photoelectric conversion units, wherein a plurality of connection transistors are included in the plurality of the transistors, each of the connection transistors being configured to control an electrical connection between the input node of a corresponding one of the first input transistors and the input node of a corresponding one of the second input transistors, and wherein the plurality of the connection transistors are repeatedly arranged correspondingly to every one or more of the photoelectric conversion units.

* * * * *